(12) United States Patent
Kobayashi et al.

(10) Patent No.: US 12,355,406 B2
(45) Date of Patent: Jul. 8, 2025

(54) PHOTOELECTRIC CONVERSION APPARATUS, PHOTOELECTRIC CONVERSION SYSTEM AND EQUIPMENT

(71) Applicant: CANON KABUSHIKI KAISHA, Tokyo (JP)

(72) Inventors: Hideo Kobayashi, Tokyo (JP); Kazuo Yamazaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 161 days.

(21) Appl. No.: 18/068,622

(22) Filed: Dec. 20, 2022

(65) Prior Publication Data

US 2023/0216459 A1 Jul. 6, 2023

(30) Foreign Application Priority Data

Jan. 1, 2022 (JP) ................ 2022-000022

(51) Int. Cl.
 *H03F 3/217* (2006.01)
 *H03M 1/12* (2006.01)
 *H04N 25/60* (2023.01)

(52) U.S. Cl.
 CPC .......... *H03F 3/2175* (2013.01); *H03M 1/124* (2013.01); *H04N 25/60* (2023.01)

(58) Field of Classification Search
 CPC ....... H03F 3/2175; H03M 1/124; H04N 25/60
 USPC ....................................................... 348/300
 See application file for complete search history.

(56) References Cited

U.S. PATENT DOCUMENTS

| | | | |
|---|---|---|---|
| 7,816,755 B2 | 10/2010 | Yamazaki et al. | |
| 7,889,254 B2 | 2/2011 | Kochi et al. | |
| 7,990,440 B2 | 8/2011 | Kobayashi et al. | |
| 8,049,799 B2 | 11/2011 | Sonoda et al. | |
| 8,325,260 B2 | 12/2012 | Yamazaki et al. | |
| 8,710,558 B2 | 4/2014 | Inoue et al. | |
| 8,754,799 B2 * | 6/2014 | Coln | H03M 1/124 341/172 |
| 8,760,337 B2 | 6/2014 | Yamazaki | |
| 8,810,706 B2 | 8/2014 | Yamazaki et al. | |
| 8,836,313 B2 | 9/2014 | Takagi et al. | |
| 8,884,391 B2 | 11/2014 | Fudaba et al. | |
| 9,060,139 B2 | 6/2015 | Yamazaki | |
| 9,264,641 B2 | 2/2016 | Kobayashi | |
| 9,288,415 B2 | 3/2016 | Yamazaki et al. | |
| 9,305,954 B2 | 4/2016 | Kato et al. | |
| 9,357,122 B2 | 5/2016 | Kususaki et al. | |
| 9,407,847 B2 | 8/2016 | Maehashi et al. | |
| 9,438,828 B2 | 9/2016 | Itano et al. | |

(Continued)

FOREIGN PATENT DOCUMENTS

JP 2020-014110 A 1/2020

*Primary Examiner* — Joel W Fosselman
(74) *Attorney, Agent, or Firm* — Venable LLP

(57) ABSTRACT

A photoelectric conversion apparatus includes a pixel which includes a photoelectric conversion element; a signal line connected with the pixel; a voltage-current conversion unit configured to convert a voltage signal of the signal line into current; and a conversion unit that includes an oversampling type analog-to-digital conversion circuit that converts the current outputted from the voltage-current conversion unit into digital signals. The voltage-current conversion unit converts the voltage signal of the signal line into the current without sampling and holding and outputs the converted current to the conversion unit.

19 Claims, 29 Drawing Sheets

(56) References Cited

U.S. PATENT DOCUMENTS

| | | |
|---|---|---|
| 9,438,841 B2 | 9/2016 | Yamazaki et al. |
| 9,509,931 B2 | 11/2016 | Kobayashi et al. |
| 9,602,752 B2 | 3/2017 | Kobayashi et al. |
| 9,667,901 B2 | 5/2017 | Sakai et al. |
| 9,681,076 B2 | 6/2017 | Oguro et al. |
| 9,762,840 B2 | 9/2017 | Yamazaki et al. |
| 10,015,430 B2 | 7/2018 | Kobayashi et al. |
| 10,403,658 B2 | 9/2019 | Takada et al. |
| 10,609,316 B2 | 3/2020 | Kobayashi |
| 10,834,354 B2 | 11/2020 | Kobayashi et al. |
| 10,992,886 B2 | 4/2021 | Yamazaki et al. |
| 11,115,608 B2 | 9/2021 | Sakai et al. |
| 11,268,851 B2 | 3/2022 | Kobayashi et al. |
| 11,310,450 B2 | 4/2022 | Okada et al. |
| 11,310,453 B2 | 4/2022 | Takada et al. |
| 11,431,929 B2 | 8/2022 | Kobayashi et al. |
| 11,463,644 B2 | 10/2022 | Soda et al. |
| 11,470,275 B2 | 10/2022 | Kobayashi et al. |
| 11,496,704 B2 | 11/2022 | Sato et al. |
| 2005/0094009 A1* | 5/2005 | Mori ............... H04N 25/633 348/E5.081 |
| 2021/0021770 A1 | 1/2021 | Nakazawa et al. |
| 2021/0281784 A1 | 9/2021 | Okada et al. |
| 2021/0314508 A1 | 10/2021 | Kusano et al. |
| 2021/0360180 A1 | 11/2021 | Saito et al. |
| 2022/0030164 A1 | 1/2022 | Kobayashi |
| 2022/0201233 A1 | 6/2022 | Takada et al. |
| 2022/0247964 A1 | 8/2022 | Kobayashi |
| 2022/0272295 A1 | 8/2022 | Kobayashi et al. |
| 2022/0302199 A1 | 9/2022 | Kobayashi |
| 2022/0303484 A1 | 9/2022 | Kobayashi |
| 2022/0303485 A1 | 9/2022 | Kobayashi et al. |
| 2022/0303486 A1 | 9/2022 | Kobayashi |
| 2023/0041974 A1 | 2/2023 | Kobayashi |
| 2023/0070568 A1 | 3/2023 | Kobayashi et al. |
| 2023/0072715 A1 | 3/2023 | Kobayashi |

* cited by examiner

PHOTOELECTRIC CONVERSION APPARATUS, PHOTOELECTRIC CONVERSION SYSTEM AND EQUIPMENT

BACKGROUND OF THE INVENTION

Field of the Invention

The present invention relates to a photoelectric conversion apparatus, a photoelectric conversion system, and equipment equipped therewith.

Description of the Related Art

A solid-state imaging apparatus that samples and holds pixel signals and then performs analog-to-digital conversion thereon is disclosed in Japanese Patent Application Publication No. 2020-014110.

More particularly, the solid-state imaging apparatus disclosed in Japanese Patent Application Publication No. 2020-014110 includes: a circuit that samples and holds a difference between voltage of a vertical signal line in accordance with a quantity of light received by a pixel and predetermined reference voltage, as sample signal voltage; and an ADC that performs analog-to-digital conversion on the sample signal voltage.

However, in the case of the configuration of the conventional apparatus which performs the analog-to-digital conversion after sampling and holding the pixel signals, accuracy of the analog-to-digital conversion and quality of the image generated thereby may drop because of the influence of random noise included in the pixel signals.

SUMMARY OF THE INVENTION

With the foregoing in view, it is an object of the present invention to provide a technique that enables highly accurate and high quality photoelectric conversion that is not easily influenced by noise very much.

The present disclosure includes a photoelectric conversion apparatus including: a pixel which includes a photoelectric conversion element; a signal line connected with the pixel; a voltage-current conversion unit configured to convert a voltage signal of the signal line into current; and a conversion unit that includes an oversampling type analog-to-digital conversion circuit that converts the current outputted from the voltage-current conversion unit into digital signals, wherein a sample-and-hold unit does not exist between the signal line and the conversion unit.

The present disclosure includes a photoelectric conversion apparatus including: a pixel which includes a photoelectric conversion element; a signal line connected with the pixel; a voltage-current conversion unit configured to convert a voltage signal of the signal line into current; and a conversion unit that includes an oversampling type analog-to-digital conversion circuit that converts the current outputted from the voltage-current conversion unit into digital signals, wherein a signal path from the signal line to the conversion unit includes a path where a sample-and-hold unit does not exist.

The present disclosure includes a photoelectric conversion apparatus including: a pixel which includes a photoelectric conversion element; a signal line connected with the pixel; a voltage-current conversion unit configured to convert a voltage signal of the signal line into current; and a conversion unit that includes an oversampling type analog-to-digital conversion circuit that converts the current outputted from the voltage-current conversion unit into digital signals, wherein the voltage-current conversion unit is configured to enable to output the current, which was converted from the voltage signal of the signal line without sampling and holding, to the conversion unit.

The present disclosure includes a photoelectric conversion system including: the photoelectric conversion apparatus; and a signal processing unit configured to process a signal outputted from the photoelectric conversion apparatus.

The present disclosure includes equipment including: the photoelectric conversion apparatus; and at least one of an optical system corresponding to the photoelectric conversion apparatus, a control device that controls the photoelectric conversion apparatus, a processing device that processes a signal outputted from the photoelectric conversion apparatus, a display device that displays information acquired by the photoelectric conversion apparatus, a storage device that stores information acquired by the photoelectric conversion apparatus, and a mechanical device that operates based on the information acquired by the photoelectric conversion apparatus.

Further features of the present invention will become apparent from the following description of exemplary embodiments with reference to the attached drawings.

DESCRIPTION OF THE EMBODIMENTS

Example 1

Figure 1:
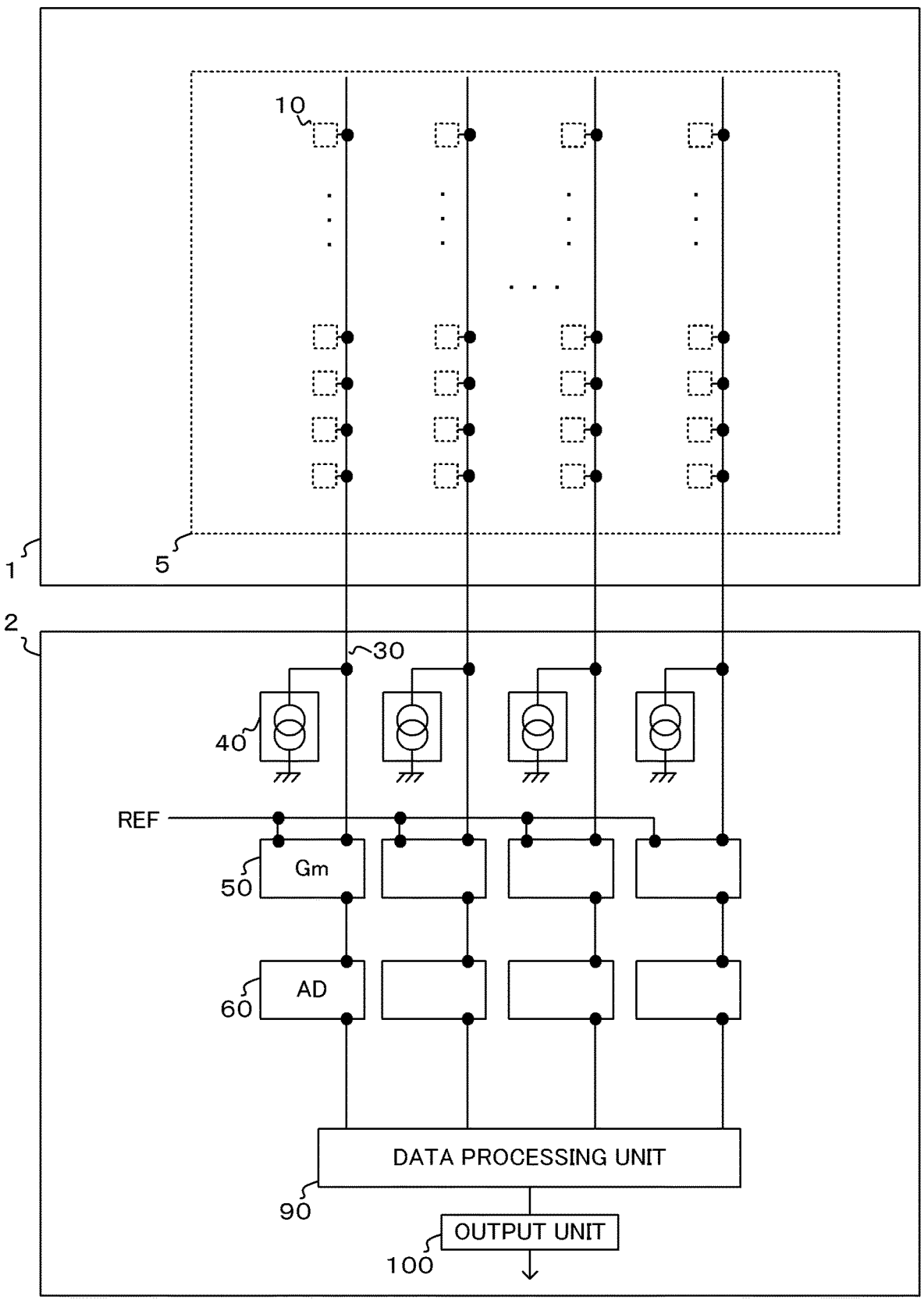
FIG. 1 is a schematic diagram of a photoelectric conversion apparatus according to Example 1.

FIGS. 1, 2, 3 and 4 are schematic diagrams and a timing chart of a photoelectric conversion apparatus according to Example 1. In FIG. 1, 1 is a pixel substrate, 2 is a circuit board, 5 is a pixel unit, 10 is a pixel, 30 is a vertical signal line, 40 is a current source, 50 is a voltage-current conversion unit, 60 is a conversion unit, 90 is a data processing unit, and 100 is an output unit.

On the pixel unit 5, a plurality of pixels 10, each of which includes a photoelectric conversion element respectively, are disposed in a matrix. Here a row direction indicates a horizontal direction in FIG. 1, and a column direction indicates a vertical direction in FIG. 1. Each pixel 10 generates signal charges in accordance with incident light.

On the pixel unit 5, the vertical signal lines 30 are disposed in the column direction, so as to correspond to pixel columns on which the pixels 10 are disposed. The vertical signal line 30 is used to transfer a signal corresponding to the signal charges, which are generated by the photoelectric conversion element of the pixel 10, from the pixel 10 to the voltage-current conversion unit 50.

The current sources 40 are disposed so as to correspond to the vertical signal lines 30 respectively. Via the vertical signal line 30, the current source 40 supplies bias current to the pixel 10 selected to read the signal therefrom.

The voltage-current conversion unit 50 converts a voltage signal of the vertical signal line 30 into current, and supplies the current to the conversion unit 60.

The conversion unit 60 performs analog-to-digital conversion on the signal current outputted from the voltage-current conversion unit 50. In the conversion unit 60, an analog-to-digital conversion circuit is connected, so as to correspond to each vertical signal line 30 respectively. In Example 1, an oversampling type conversion circuit is used as the analog-to-digital conversion circuit. For example, a delta-sigma (ΔΣ) type analog-to-digital conversion circuit is used, but the present invention is not limited thereto.

The data processing unit 90 is a digital signal processing unit that processes digital signals outputted from each conversion unit 60. For example, the data processing unit 90 may perform correction processing, interpolation processing, or the like, on the digital signals outputted from the conversion unit 60. The output unit 100 outputs the signals processed by the data processing unit 90 to outside the chip.

Figure 2:
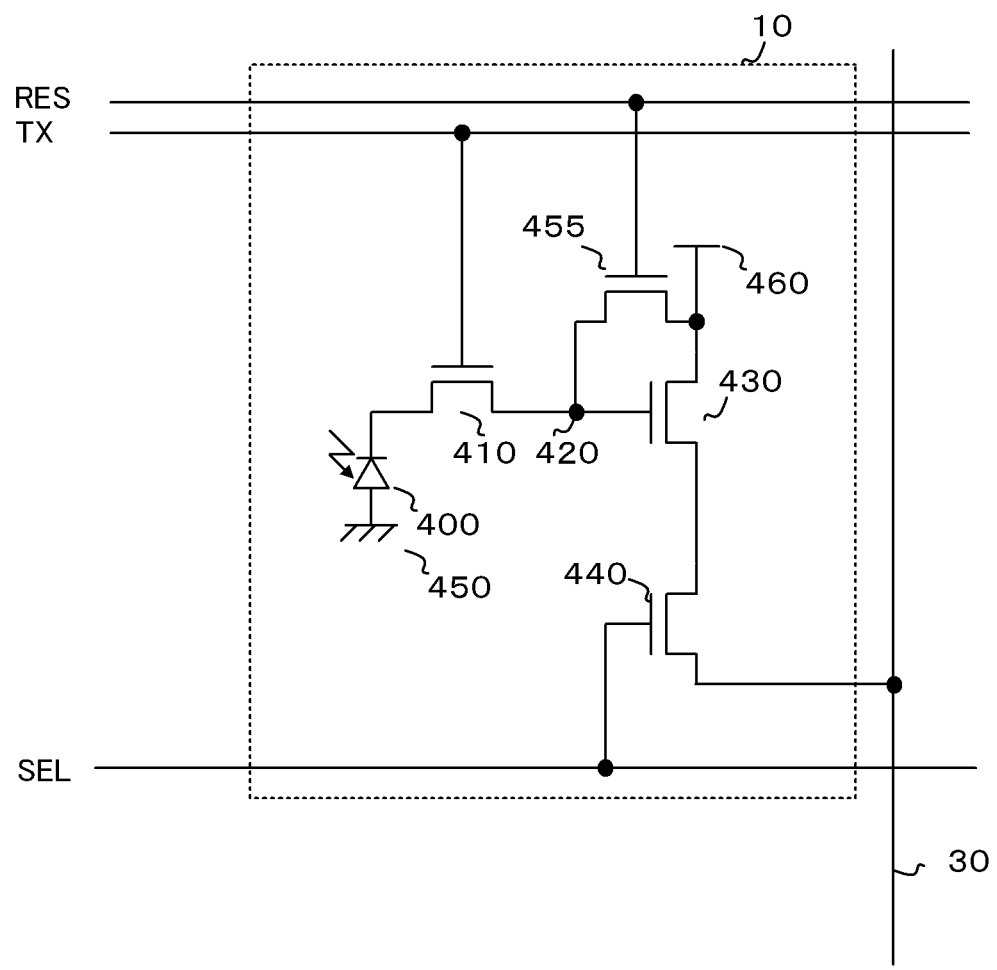
FIG. 2 is a schematic diagram of the photoelectric conversion apparatus according to Example 1.

FIG. 2 is a circuit diagram indicating a configuration example of the pixel 10. The pixel 10 includes a photoelectric conversion element 400, a transfer transistor 410, a reset transistor 455, an amplification transistor 430, and a selection transistor 440. The photoelectric conversion element 400 may be a photodiode, for example. In the photoelectric conversion element 400, one of main electrodes is connected to a ground potential 450, and the photoelectric conversion element 400 photoelectrically converts the received light into signal charges (e.g. photoelectrons) having the charge quantity in accordance with the light quantity of the received light, and stores the signal charges. The other main electrode of the photoelectric conversion element 400 is electrically connected to a gate electrode of the amplification transistor 430 via the transfer transistor 410. A node 420, to which the gate electrode of the amplification transistor 430 is electrically connected, functions as a floating diffusion. The floating diffusion is a charge-voltage conversion unit to convert the signal charges generated by the photoelectric conversion element 400 into signal voltage.

A transfer signal TX is supplied to the gate electrode of the transistor 410. When the transfer transistor 410 becomes the conduction state responding to the transfer signal TX, the photoelectric conversion element 400 performs photoelectric conversion, whereby the signal charges stored in the photoelectric conversion element 400 are transferred to the node 420 which is the floating diffusion.

The reset transistor 455 is connected between the power supply potential 460 and the node 420. Here the expression "a transistor is connected between A and B" means that "one of the main electrodes (source and drain) of the transistor is connected to A, and the other main electrode is connected to B". Here the gate electrode of the transistor is not connected to A or B.

A reset signal RES is supplied to the gate electrode of the reset transistor 455. When the reset transistor 455 becomes the conduction state responding to the reset signal RES, the potential of the node 420 (floating diffusion) is reset to the power supply potential 460, whereby the charges held in the floating diffusion are discharged.

In the amplification transistor 430, the gate electrode is connected to the node 420, one of the main electrodes is connected to the power supply potential 460, and the other main electrode is connected to the selection transistor 440 respectively. The amplification transistor 430 becomes an input unit of a source-follower that reads signals acquired by the photoelectric conversion of the photoelectric conversion element 400. In other words, in the amplification transistor 430, the other main electrode is connected to the vertical signal line 30 via the selection transistor 440. The amplification transistor 430 and the above mentioned current source 40 connected to the vertical signal line 30 constitute a source-follower to convert the voltage of the node 420 into the potential of the vertical signal line 30.

The selection transistor 440 is connected between the amplification transistor 430 and the vertical signal line 30. A selection signal SEL is supplied to the gate electrode of the selection transistor 440. When the selection transistor 440 becomes the conduction state responding to the selection signal SEL, the pixel 10 becomes the selected state, and the signal is outputted from the amplification transistor 430 to the vertical signal line 30.

The circuit configuration of the pixel 10 is not limited to the configuration indicated in FIG. 2. For example, the pixel 10 may be connected to the selection transistor 440, the power supply potential 460 and the amplification transistor 430. In FIG. 2, the pixel 10 includes the transfer transistor 410, the reset transistor 455, the amplification transistor 430 and the selection transistor 440, that is, the pixel 10 has a 4-transistor (4-Tr.) type configuration, but the present invention is not limited thereto. For example, the pixel 10 may have a 3-Tr. type configuration, where the selection transistor 440 is omitted and the amplification transistor 430 also functions as the selection transistor. Further, the pixel 10 may have 5 or more transistors, that is, such as a 5-Tr. type configuration. From the pixel 10, a reset signal, which is generated when the potential of the node 420 is reset and the photoelectric conversion element 400 is reset by the reset transistor 455, and a data signal, which indicates the signal level acquired when the photoelectric conversion element 400 performed the photoelectric conversion, may be sequentially outputted.

Figure 3:
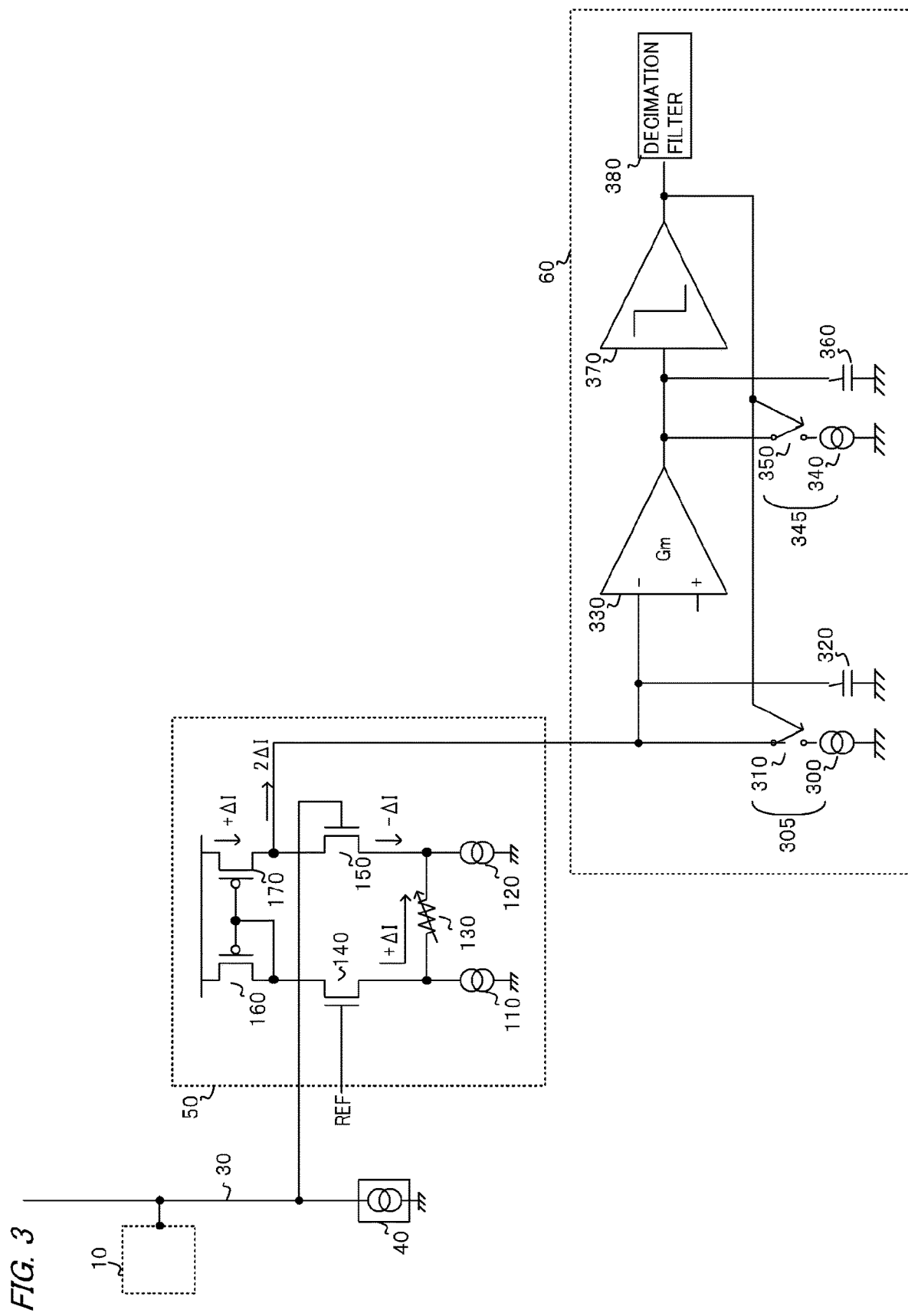
FIG. 3 is a schematic diagram of the photoelectric conversion apparatus according to Example 1.

FIG. 3 is a diagram indicating a configuration example of circuits focusing on the voltage-current conversion unit 50 and the conversion unit 60. FIG. 3 indicates the voltage-current conversion unit 50 and the conversion unit 60 which are disposed corresponding to one vertical signal line 30. The voltage-current conversion unit 50 includes current sources 110 and 120, a variable resistor 130, N type transistors 140 and 150, and P-type transistors 160 and 170.

As indicated in FIG. 3, the variable resistor 130 is disposed between the source of the N-type transistor 140 and the source of the N-type transistor 150. Reference voltage REF is applied to the gate of the N-type transistor 140, and voltage of the vertical signal line 30 is applied to the gate of the N-type transistor 150. Since the signal voltage $\Delta V$ corresponding to the difference thereof is generated on both ends of the variable resistor 130, the signal current of $\Delta I = \Delta V/R$, where R is a resistance value of the variable resistor 130, flows through the variable resistor 130. Here the current that flows through the N-type transistor 140 increases by $\Delta I$, and the current that flows through the N-type transistor 150 decreases by $\Delta I$. Since the P-type transistors 160 and 170 form a current mirror, the current that flows through the P-type transistor 170 increases by $\Delta I$. As a result, $2\Delta I$ of signal current is outputted from the voltage-current conversion unit 50.

For the conversion unit 60, an $\Delta\Sigma$ type analog-to-digital conversion circuit is used in Example 1 so as to correspond to one vertical signal line 30. The $\Delta\Sigma$ type analog-to-digital conversion circuit includes a first integrator, a second integrator, a quantizer 370, and a decimation filter 380. The first integrator is constituted of an integral capacitor 320. The second integrator is constituted of a Gm cell 330 to convert the voltage into current, and an integral capacitor 360. To the input node of the first integrator, a digital-to-analog converter 305, which includes a current source 300 and a switch 310, is connected. The digital-to-analog converter 305 controls the current to the first integrator in accordance with the digital signal via the second integrator and the quantizer 370. To the input node of the second integrator, a digital-to-analog converter 345, which includes the current source 340 and the switch 350, is connected. The digital-to-analog converter 345 controls the current to the second integrator in accordance with the result of quantizing the output of the second integrator using the quantizer 370.

In the $\Delta\Sigma$ type analog-to-digital conversion circuit, the quantizer 370 feeds back the previous quantized value to the digital-to-analog converters 305 and 345. Then a difference value between the signal current $2\Delta I$ generated by the voltage-current conversion unit 50 and the output current of the digital-to-analog converter 305 is integrated by the first integrator, and a difference value between the output current of the Gm cell 330 and the output current of the digital-to-analog converter 345 is integrated by the second integrator. This operation is repeated many times (e.g. 128 times if the oversampling rate is 128) during the AD conversion, and noise components of the pixel 10, included in the signal current $2\Delta I$, are integrated a plurality of times. Thereby the noise components of the pixel 10 are compressed and reduced considerably. By inputting the pixel signal to the $\Delta\Sigma$ type analog-to-digital conversion circuit like this without sampling and holding the pixel signal, the pixel noise can be oversampled and the pixel noise can be reduced.

In a conventional photoelectric conversion apparatus, on the other hand, a pixel signal that is fixed (sampled) by a sample-and-hold circuit is inputted to the analog-to-digital conversion circuit. In the case of this configuration, an instantaneous value of the pixel signal at the point of sampling is held, hence a pixel signal, which includes pixel noise (random noise generated by the pixel) is analog-to-digital converted. Therefore, the pixel noise cannot be reduced by oversampling in the $\Delta\Sigma$ type analog-to-digital conversion circuit. The photoelectric conversion apparatus of Example 1, on the other hand, has no sample-and-hold circuit between the vertical signal line 30 and the conversion unit 60. In other words, in the case of Example 1, the signal path from the vertical signal line 30 to the conversion unit 60 includes a path on which the sample-and-hold circuit does not exist, and by using this path, the current $2\Delta I$ generated by converting the voltage signal of the vertical signal line 30 without sampling and holding can be outputted to the conversion unit 60. In other words, whereas the conventional apparatus performs the sampling of a pixel signal only once using the sample-and-hold circuit, the photoelectric conversion apparatus of Example 1 samples a pixel signal a plurality of times in a state where the vertical signal line 30 is connected to the conversion unit 60 (tracked) during a predetermined period. Because of this configuration, the pixel noise can be reduced, and highly accurate and high quality photoelectric conversion can be implemented.

Figure 4:
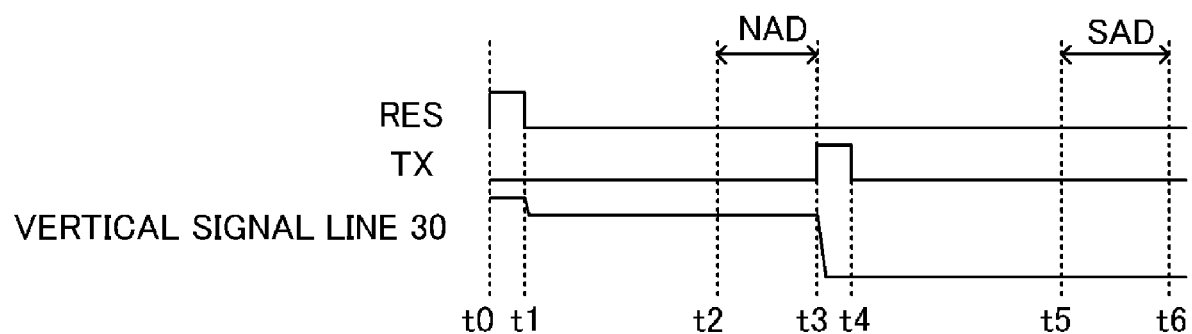
FIG. 4 is a timing chart of the photoelectric conversion apparatus according to Example 1.

The operation example will be further described with reference to the timing chart in FIG. 4. In time t0 to t1, the control signal RES in FIG. 2 become high level and the reset transistor 455 turns ON, whereby the floating diffusion 420 is reset. Accordingly, the potential of the vertical signal line 30 becomes reset level. At time t1, the control signal RES becomes low level and the reset transistor 455 turns OFF. Here the potential of the floating diffusion 420 decreases, hence the potential of the vertical signal line 30 also decreases. After the potential of the vertical signal line 30 stabilizes, AD conversion (NAD) of the reset level is started at time t2. As mentioned above, the signal current $2\Delta I$ corresponding to the difference between the reference voltage REF and the potential of the vertical signal line 30 is outputted from the voltage-current conversion unit 50. Here the signal current corresponding to the reset level of the vertical signal line 30 is assumed to be $2\Delta In$. If the NAD period is 128 clock cycles, for example, the previous quantized value of the quantizer 370 is fed back to the digital-to-analog converters 305 and 345, and the same quantized value is sent to the decimation filter 380. The decimation filter 380 performs such processing as the moving average, whereby highly accurate AD conversion is performed. Here the noise components of the pixel 10, included in the signal current 2ΔIn, are integrated a plurality of times, therefore the noise components of the pixel 10 can be reduced considerably.

In time t3 to t4, the control signal TX in FIG. 2 becomes high level and the transfer transistor 410 turns ON, whereby the photoelectric charges are transferred from the photoelectric conversion element 400 to the floating diffusion 420. The potential of the floating diffusion 420 decreases as the quantity of the charges decreases. Thereby the potential of the vertical signal line 30 decreases. After the potential of the vertical signal line 30 stabilizes, AD conversion (SAD) of the signal level of the vertical signal line 30 is started at time t5. Here the signal current corresponding to the signal level of the vertical signal line 30 is assumed to be 2ΔIs. In the SAD period, just like the NAD period, the AD conversion, in which the noise components of the pixel 10 are reduced considerably, can be performed. The AD conversion results of the reset level and the signal level are sent to the data processing unit 90, where the difference thereof is determined, and digital correlated double sampling (CDS) processing is performed thereby.

As described above, in Example 1, the sample-and-hold circuit does not exist between the vertical signal line 30 and the conversion unit 60, and a pixel signal is sampled for a plurality of times in a state where the vertical signal line 30 is connected to the conversion unit 60 (tracked) for a predetermined period. Thereby the pixel noise can be reduced.

Further, a current input ΔΣ type analog-to-digital conversion circuit is used for the conversion unit 60, which is advantageous in terms of decreasing voltage.

Furthermore, in the configuration of Example 1, the gain can be switched by switching the resistance value of the variable resistor 130.

In Example 1, a differential pair is used for the voltage-current conversion unit 50 as an example, but the present invention is not limited thereto. A single end type voltage-current conversion circuit may be used instead. In terms of the power supply rejection ratio (PSRR) however, the configuration using the differential pair is preferable.

Example 2

Figure 5:
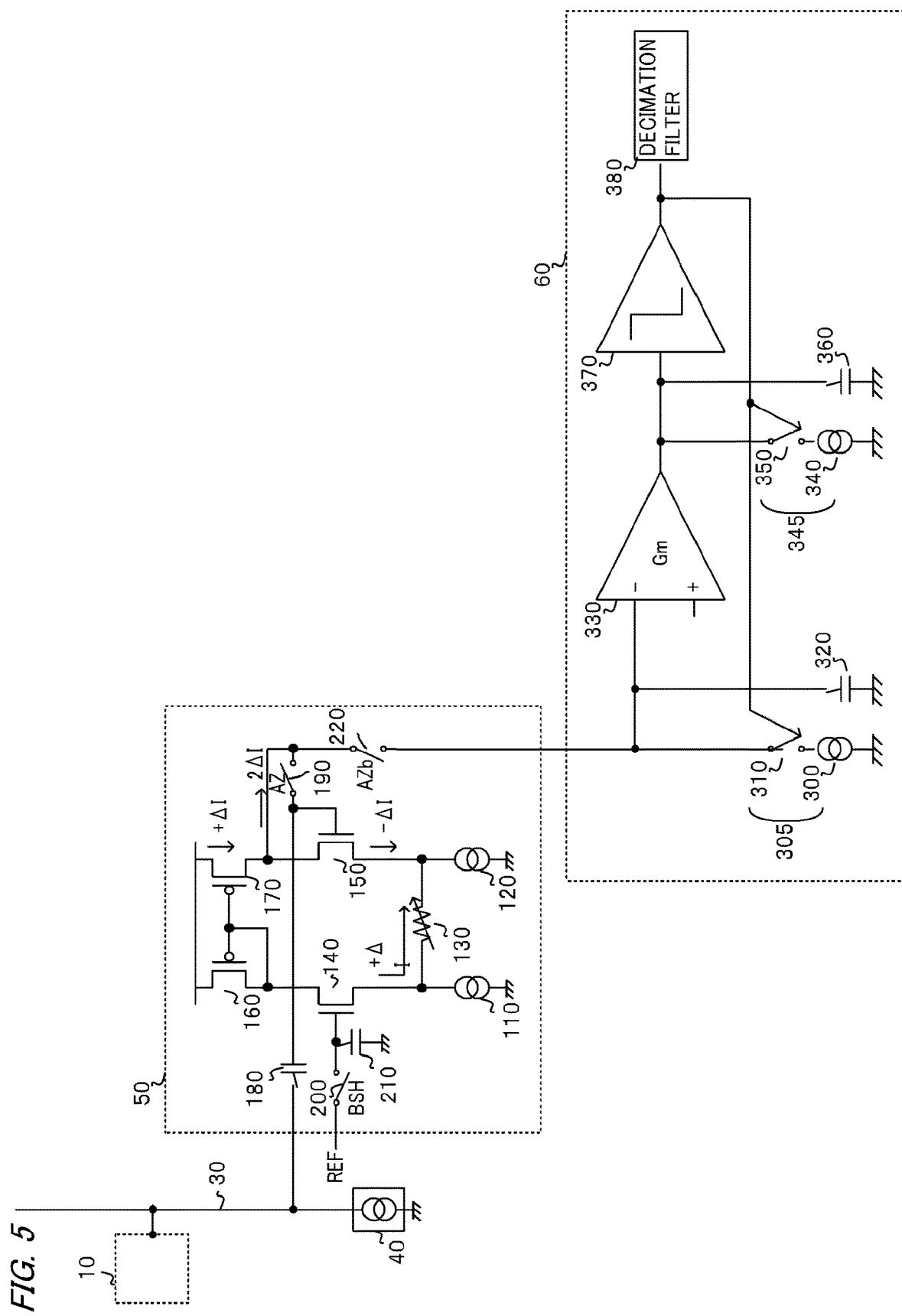
FIG. 5 is a schematic diagram of a photoelectric conversion apparatus according to Example 2.
Figure 6:
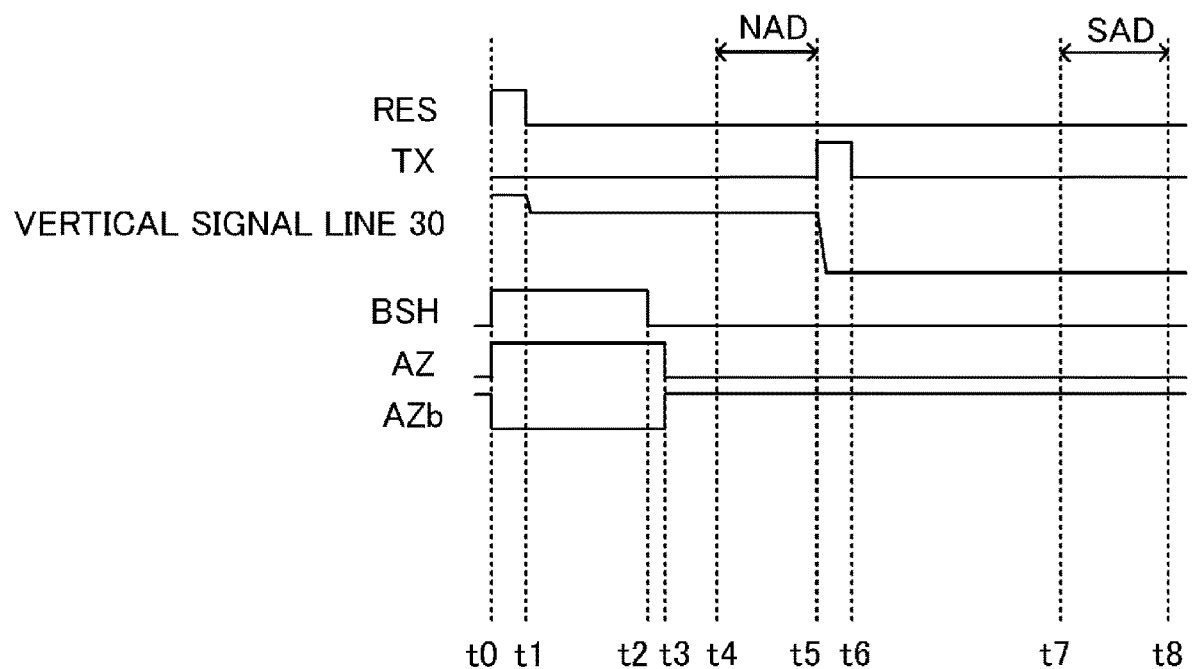
FIG. 6 is a timing chart of the photoelectric conversion apparatus according to Example 2.

FIGS. 5 and 6 are a schematic diagram and a timing chart of a photoelectric conversion apparatus according to Example 2. In the following, only the differences from FIGS. 3 and 4 of Example 1 will be described. In FIG. 5, a switch 200 and a capacitor 210, to sample and hold the reference voltage REF, are included. Thereby the deterioration of image quality caused by the noise of the reference voltage REF can be reduced. Further, in FIG. 5, a capacitor 180 and switches 190 and 220 are included for the voltage-current conversion unit 50 to perform auto-zero operation, while clamping the voltage of the vertical signal line 30. Thereby the dispersion of the output current caused by the characteristic dispersion of the pixel 10, and the offset dispersion of the voltage-current conversion unit 50, can be reduced.

The operation will be described with reference to the timing chart in FIG. 6. In time t0 to t2, the control signal BSH becomes high level, whereby the switch 200 turns ON. Then at time t2, the control signal BSH is switched to low level, whereby the switch 200 turns OFF, and is thereafter maintained at the low level during the NAD period in time t4 to t5 and the SAD period in time t7 to t8. Thereby fluctuation of the gate voltage of the transistor 140 in the NAD period and the SAD period caused by the random noise of the reference voltage REF can be reduced. As a result, deterioration of the image quality caused by the noise of the reference voltage REF can be reduced. In time t0 to t3, the control signal AZ becomes high level and the control signal AZb becomes low level, whereby the switch 190 turns ON and the switch 220 turns OFF. At time t3, the control signal AZ is switched to low level, and the control signal AZb is switched to high level, whereby the switch 190 turns OFF and the switch 220 turns ON. By this operation, the reset level of the vertical signal line 30 is held at the clamp capacitor 180. Thereby the DC offset of the reset level, due to the characteristic dispersion (e.g. threshold dispersion of the selection transistor 440) of the pixel 10, can be cancelled (auto-zero operation). As a result, the dispersion of the output current of the voltage-current conversion unit 50 can be reduced.

In Example 2, the capacitor 180 is disposed on the signal path from the vertical signal line 30 to the conversion unit 60, but noise other than the DC components emitted from the pixel 10 are all transferred to the conversion unit 60. However, even in Example 2, the sample-and-hold circuit does not exist between the vertical signal line 30 and the conversion unit 60, and a pixel signal is sampled for a plurality of times in a state where the vertical signal line 30 is connected to the conversion unit 60 for a predetermined period. Thereby the pixel noise can be reduced.

Example 3

Figure 7:
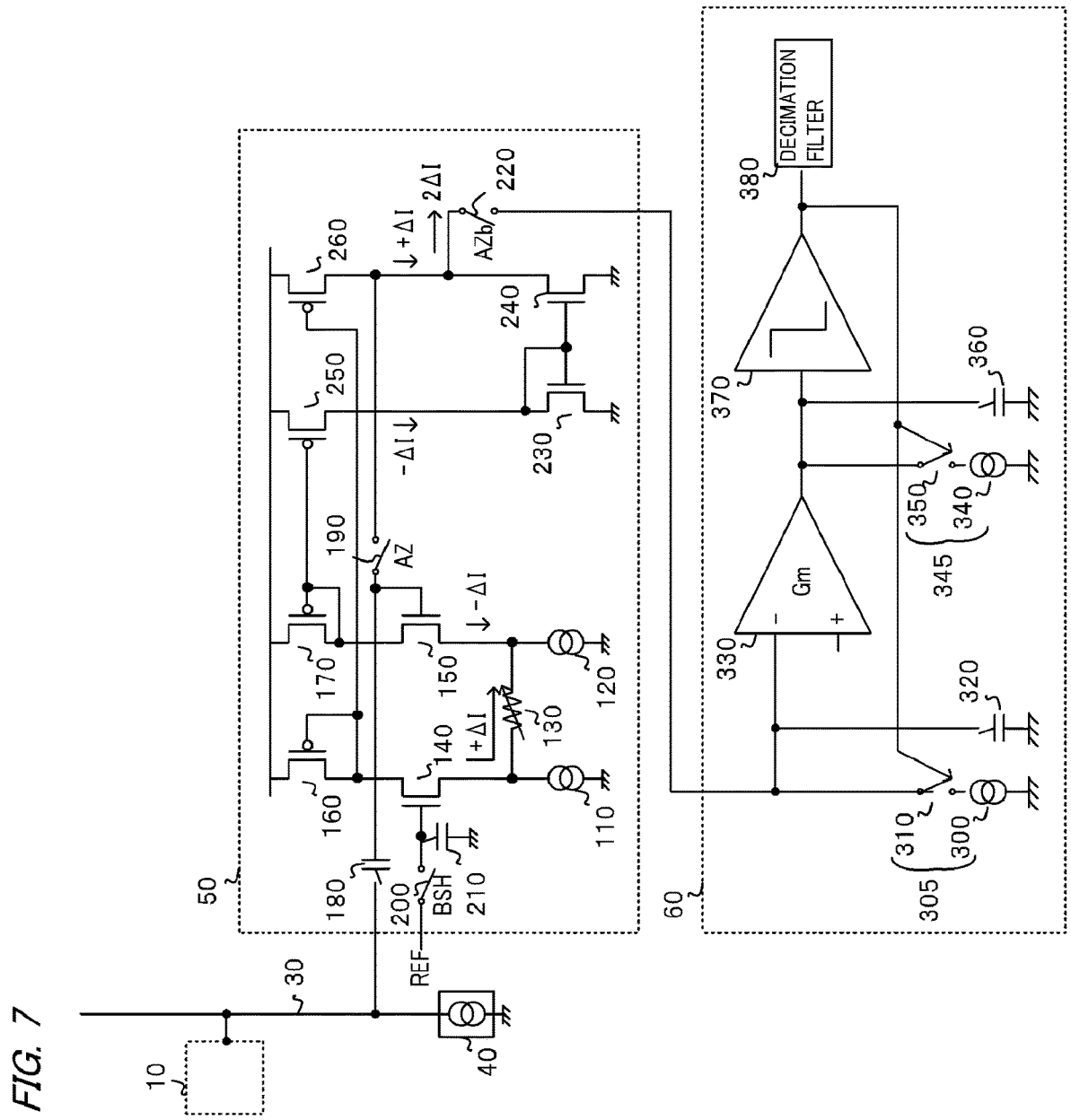
FIG. 7 is a schematic diagram of a photoelectric conversion apparatus according to Example 3.

FIG. 7 is a schematic diagram of a photoelectric conversion apparatus according to Example 3. In the following, only the differences from FIG. 5 of Example 2 will be described. Whereas the voltage-current conversion unit 50 includes only one stage (only the differential stage) in FIG. 5. Example 3 further includes N-type transistors 230 and 240 and P-type transistors 250 and 260, which constitute a current amplification stage. In FIG. 7, the signal current of +ΔI and −ΔI flows through the N-type transistors 140 and 150 respectively, just like FIG. 5. In Example 3, the P-type transistor 160 and the P-type transistor 260 form a current mirror, and the P-type transistor 170 and the P-type transistor 250 form a current mirror. Thereby the signal current +ΔI flow through the P-type transistors 160 and 260, the signal current −ΔI flows through the P-type transistors 170 and 250, and Δ2I is outputted to the conversion unit 60, just like FIG. 5. Here whereas the total of the signal current of the P-type transistors 160 and 170 is 2ΔI in FIG. 5, and the total of the signal current of the P-type transistors 160, 170, 250 and 260 is zero in FIG. 7. In other words, in FIG. 7, the dependency of the current consumption of the voltage-current conversion unit 50 on the illuminance (dependence of the vertical signal line 30 on the signal) can be reduced. Thereby mutual interference between the voltage-current conversion units 50 can be reduced, and deterioration of the image quality can be reduced.

In Example 3 as well, the sample-and-hold circuit does not exist between the vertical signal line 30 and the conversion unit 60, and a pixel signal is sampled for a plurality of times in a state where the vertical signal line 30 is connected to the conversion unit 60 for a predetermined period. Thereby the pixel noise can be reduced.

Example 4

Figure 8:
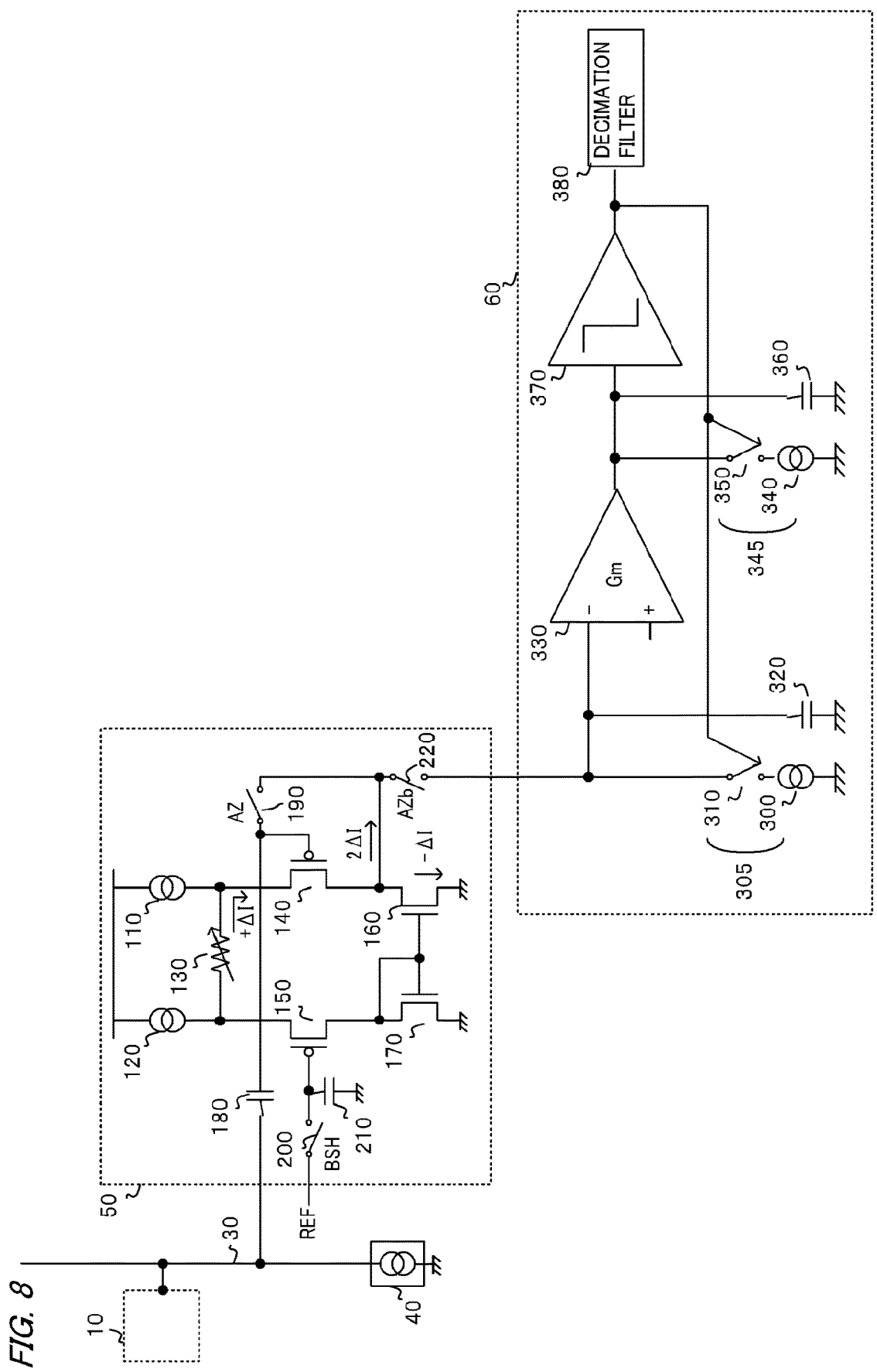
FIG. 8 is a schematic diagram of a photoelectric conversion apparatus according to Example 4.

FIG. 8 is a schematic diagram of a photoelectric conversion apparatus according to Example 4. In the following, only the differences from FIG. 5 of Example 2 will be described. In Example 4, in the voltage-current conversion unit 50, a differential pair is formed using the P-type transistors 140 and 150. Further, a current mirror is formed using the N-type transistors 160 and 170. In Example 4, when the signal current of +ΔI flows through the P-type transistor 140 due to the difference between the reference voltage REF and the voltage of the vertical signal line 30, the signal current of −ΔI flows through the P-type transistor 150. Then the signal current of 2ΔI is outputted from the voltage-current conversion unit 50, just like the above examples. If the current of the current source 110 and that of the current source 120 are assumed to be constant, the dependency of the current consumption of the voltage-current conversion unit 50 on the illuminance (dependence of the vertical signal line 30 on the signal) can be reduced in Example 4, just like Example 3. Further, a number of elements is less than that of Example 3, which is advantageous in terms of area saving. If a common GND is used for the N-type transistors 160, 170 and the current source 300, the current on the GND side can also be maintained as constant.

In Example 4 as well, the sample-and-hold circuit does not exist between the vertical signal line 30 and the conversion unit 60, and a pixel signal is sampled for a plurality of times in a state where the vertical signal line 30 is connected to the conversion unit 60 for a predetermined period. Thereby the pixel noise can be reduced.

Example 5

Figure 9:
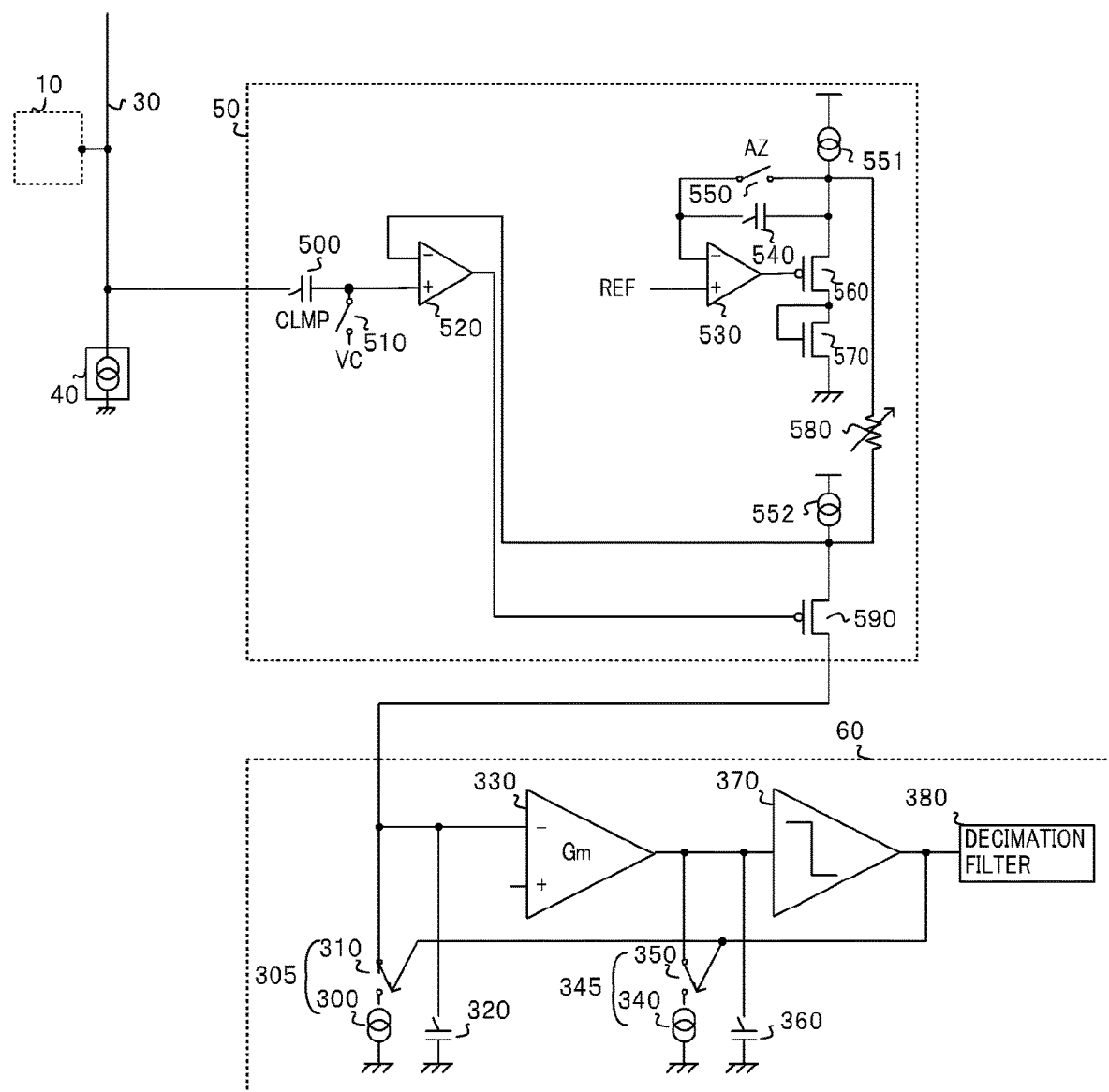
FIG. 9 is a schematic diagram of a photoelectric conversion apparatus according to Example 5.
Figure 10:
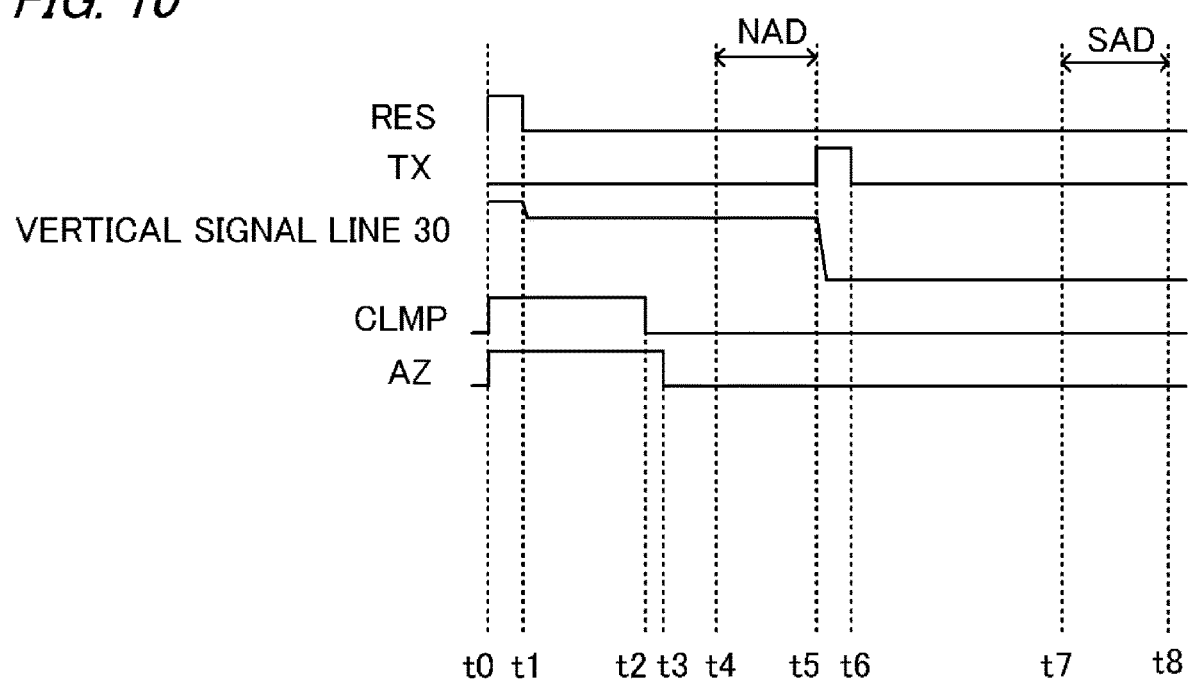
FIG. 10 is a timing chart of the photoelectric conversion apparatus according to Example 5.

FIGS. 9 and 10 are a schematic diagram and a timing chart of a photoelectric conversion apparatus according to Example 5. In the following, only the differences from FIGS. 3 and 4 of Example 1 will be described. FIG. 9 includes a capacitor 500, a switch 510, operational amplifiers 520 and 530, a capacitor 540, a switch 550, current sources 551 and 552, a P-type transistor 560, an N-type transistor 570, a variable resistor 580 and a P-type transistor 590. In FIG. 3, the voltage of the vertical signal line 30 and the reference voltage REF are directly applied to the gates of the transistors 140 and 150 forming the differential pair connected to the variable resistor 130. In Example 5, on the other hand, the gates of the P-type transistors 560 and 590 connected to the variable resistor 580 are driven via the operational amplifiers 520 and 530. The operational amplifiers 520 and 530 operate such that the potentials of the sources of the P-type transistors 560 and 590 become the same as the potentials of the non-inverting input terminals of the operational amplifiers 520 and 530 respectively. The voltage of the former non-inverting input terminal is based on the signal of the vertical signal line 30, and the voltage of the latter non-inverting input terminal is based on the reference voltage REF. Thereby a more desirable voltage-current conversion can be performed using the variable resistor 580, and accuracy can be improved.

Aspects that are different from the timing chart in FIG. 4 will be mainly described with reference to the timing chart in FIG. 10. In time t0 to t1, the control signal RES becomes high level and the reset transistor 455 turns ON, whereby the floating diffusion 420 is reset. Accordingly, the potential of the vertical signal line 30 becomes reset level. At time t1, the control signal RES becomes low level and the reset transistor 455 turns OFF. Here the potential of the floating diffusion 420 decreases, hence the potential of the vertical signal line 30 also decreases.

After the potential of the vertical signal line 30 stabilizes, the control signal CLMP becomes low level and the switch 510 turns OFF. Thereby the voltage corresponding to the reset level of the vertical signal line 30 is clamped using the capacitor 500. As a result, the influence of kT/C noise generated in the pixel 10 and the threshold dispersion and the like of the amplification transistor 430 on the output current can be reduced. The potential of the source of the P-type transistor 590 becomes approximately the same as the reference voltage VC. At time t3, the control signal AZ becomes low level and the switch 550 turns OFF. The potential of the source of the P-type transistor 560 becomes approximately the same as the reference voltage REF.

At time t4, the AD conversion (NAD) of the reset level is started. Since the signal voltage ΔV, corresponding to the difference of the source voltages between the P-type transistors 560 and 590, is generated on both ends of the variable resistor 580, the signal current of ΔI=ΔV/R (where R is a resistance value of the variable resistor 580) flows through the variable resistor 580, and is outputted to the conversion unit 60. The random noise components of the pixel 10 appears on the vertical signal line 30, and is transferred to the source of the P-type transistor 590. Therefore, the output current ΔI is fluctuated by the random noise components of the pixel 10, but this influence can be reduced considerably in the NAD period from time t4, just like the above embodiments.

In time t5 to t6, the control signal TX becomes high level and the transfer transistor 410 turns ON, whereby the photoelectric charges are transferred from the photoelectric conversion element 400 to the floating diffusion 420. The potential of the floating diffusion 420 decreases as the quantity of the charges decreases. Thereby the potential of the vertical signal line 30 decreases. After the potential of the vertical signal line 30 stabilizes, the AD conversion (SAD) of the signal level of the vertical signal line 30 is started at time t7. Even in the SAD period, the AD conversion, in which the noise components of the pixel 10 are reduced considerably, can be performed, just like the NAD period. The AD conversion results of the reset level and the signal level are sent to the data processing unit 90, where the difference thereof is determined, and digital correlated double sampling (CDS) is performed thereby.

As described above, in Example 5, more desirable voltage-current conversion can be performed and accuracy can be improved.

In Example 5 as well, the sample-and-hold circuit does not exist between the vertical signal line 30 and the conversion unit 60, and a pixel signal is sampled for a plurality of times in a state where the vertical signal line 30 is connected to the conversion unit 60 for a predetermined period. Thereby the pixel noise can be reduced.

Example 6

Figure 11:
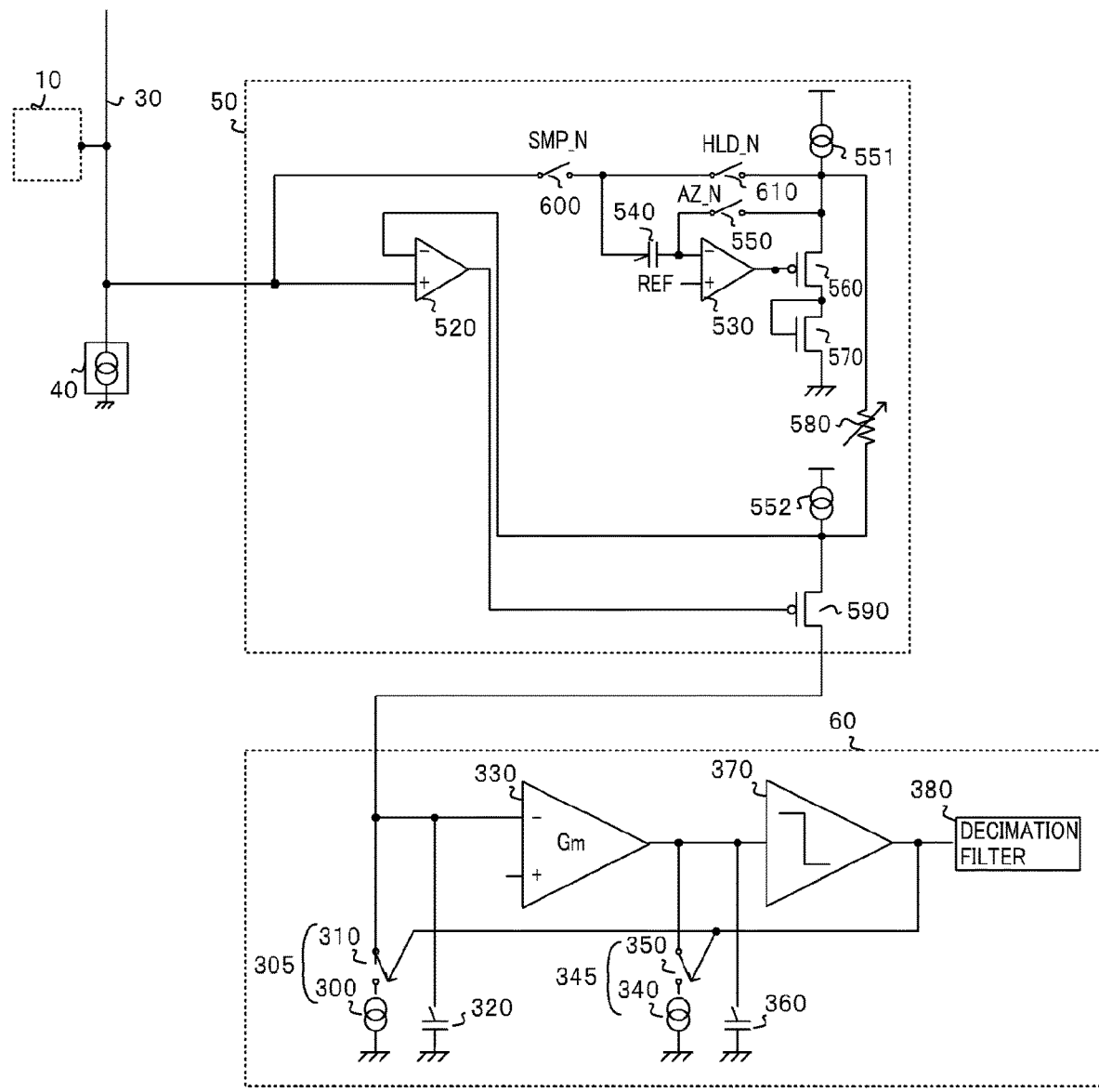
FIG. 11 is a schematic diagram of a photoelectric conversion apparatus according to Example 6.
Figure 12:
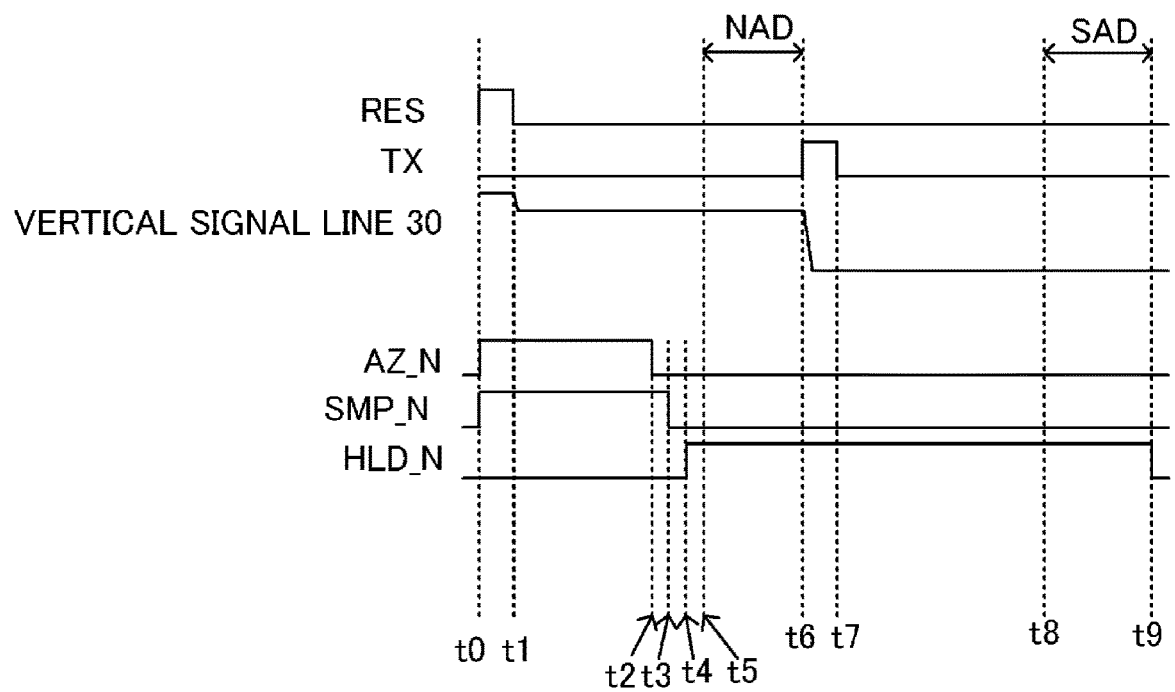
FIG. 12 is a timing chart of the photoelectric conversion apparatus according to Example 6.

FIGS. 11 and 12 are a schematic diagram and a timing chart of a photoelectric conversion apparatus according to Example 6. In the following, only the differences from FIGS. 9 and 10 of Example 5 will be described. Example 6 includes switches 600 and 610, whereby the source potential of the P-type transistor 560 can be a potential equivalent to the reset level of the vertical signal line 30. Thereby the influence of kT/C noise generated in the pixel 10 and threshold dispersion and the like of the amplification transistor 430 on the output current can be reduced without using the capacitor 500 indicated in FIG. 9.

Aspects that are different from the timing chart in FIG. 10 will be mainly described with reference to the timing chart in FIG. 12. In time t0 to t1, the control signal RES becomes high level and the reset transistor 455 turns ON, whereby the floating diffusion 420 is reset. Accordingly, the potential of the vertical signal line 30 becomes reset level. At time t1, the control signal RES becomes low level and the reset transistor 455 turns OFF. Here the potential of the floating diffusion 420 decreases, hence the potential of the vertical signal line 30 also decreases.

After the potential of the vertical signal line 30 stabilizes, the control signal AZ_N becomes low level and the switch 550 turns OFF at time t2. Then the control signal SMP_N becomes low level and the switch 600 turns OFF at time t3, and the control signal HLD_N becomes high level and the switch 610 turns ON at time t4. By this series of operations, the source potential of the P-type transistor 560 becomes the potential equivalent to the reset level of the vertical signal line 30. This reset level is a potential that includes: the kT/C noise generated in the pixel 10 when the control signal RES becomes low level and the reset transistor 455 turns OFF at time t1; and the threshold dispersion of the amplification transistor 430.

At time t5, the AD conversion (NAD) of the reset level is started. Since the signal voltage ΔV, corresponding to the difference between the source voltages of the P-type transistors 560 and 590, is generated at both ends of the variable resistor 580, the signal current of ΔI=ΔV/R (where R is a resistance value of the variable resistor 580) flows through the variable resistor 580 and is outputted to the conversion unit 60. Here both the source voltages of the P-type transistors 560 and 590 include the kT/C noise generated in the pixel 10 and the threshold dispersion of the amplification transistor 430, hence the influence on the output current can be reduced.

In Embodiment 6, the sample-and-hold circuit does not exist between the vertical signal line 30 and the voltage-current conversion unit 50, and a pixel signal is sampled for a plurality of times in a state where the vertical signal line 30 is connected to the conversion unit 60 for a predetermined period. Thereby the pixel noise can be reduced.

Further, in Example 6, the sample-and-hold circuit, constituted of the amplifier 530, the capacitor 540 and the switches 600 and 610, is included inside the voltage-current conversion unit 50. However as mentioned above, the signal and noise of the pixel 10 are transferred to the conversion unit 60 via the vertical signal line 30, the operational amplifier 520, and the source of the P-type transistor 590 during both the NAD period and the SAD period, that is, transferred to the conversion unit 60 without passing through the sample-and-hold circuit. In other words, a path, which does not pass through a sample-and-hold unit, exists between the vertical signal line 30 and the conversion unit 60. This means that in Example 6 as well, a pixel signal can be sampled for a plurality of times in a state where the vertical signal line 30 is connected to the conversion unit 60 for a predetermined period, whereby the pixel noise can be reduced.

Example 7

Figure 13:
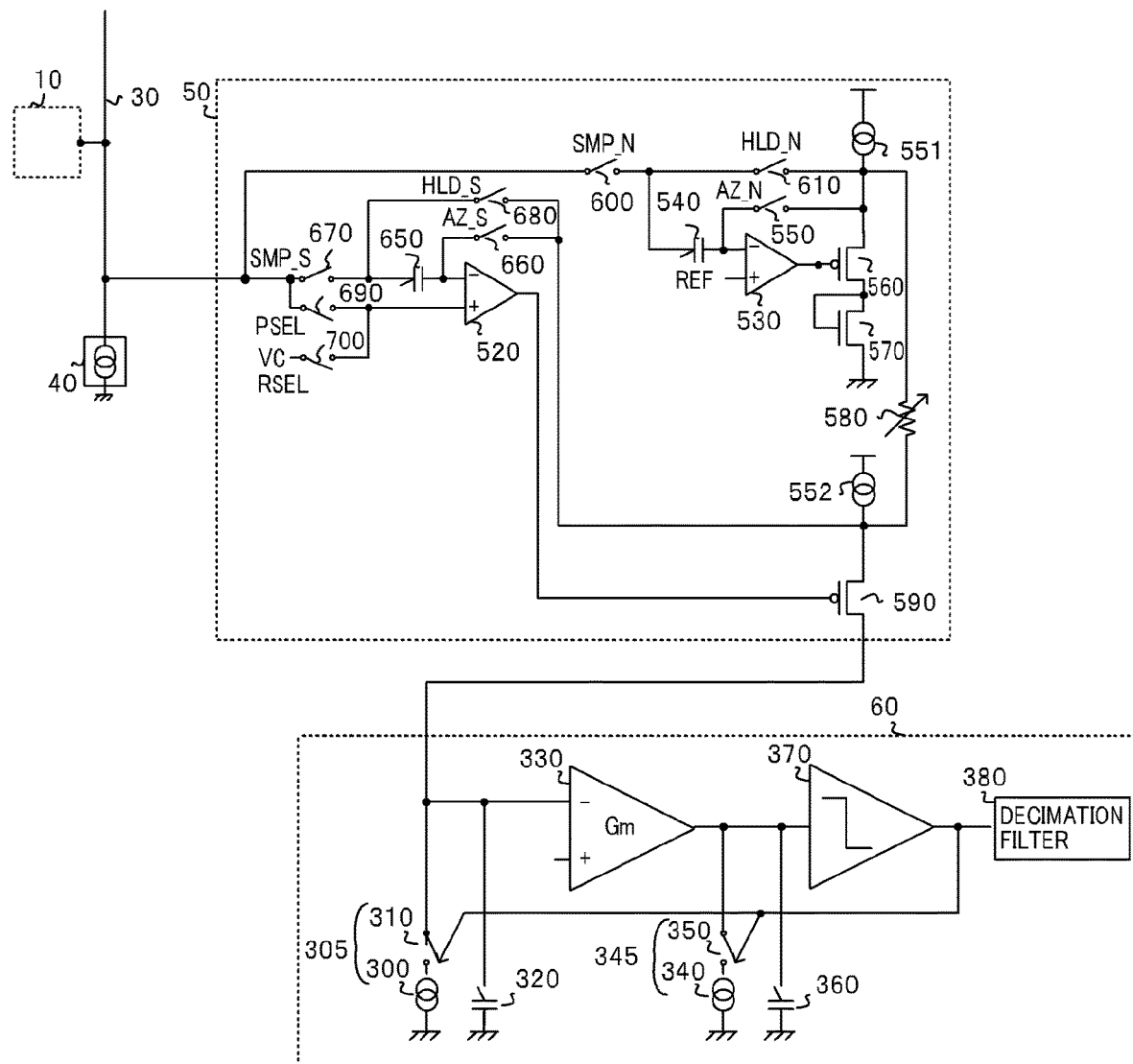
FIG. 13 is a schematic diagram of a photoelectric conversion apparatus according to Example 7.
Figure 14:
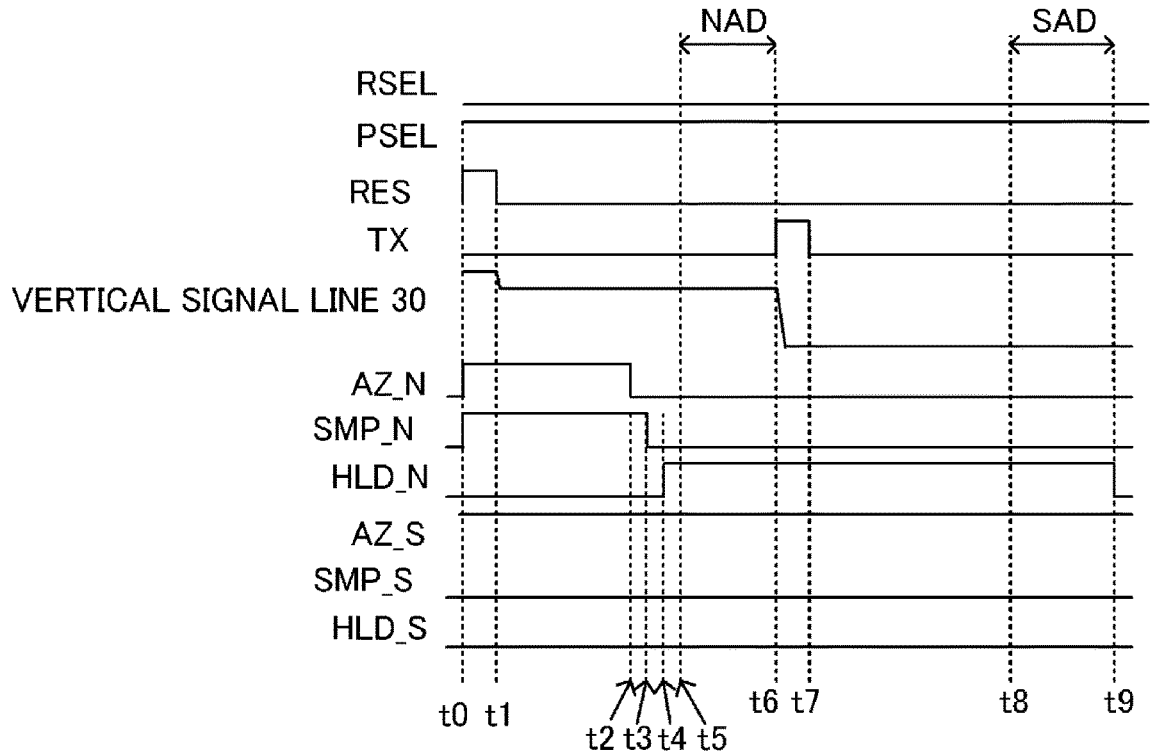
FIG. 14 is a timing chart of the photoelectric conversion apparatus according to Example 7.
Figure 15:
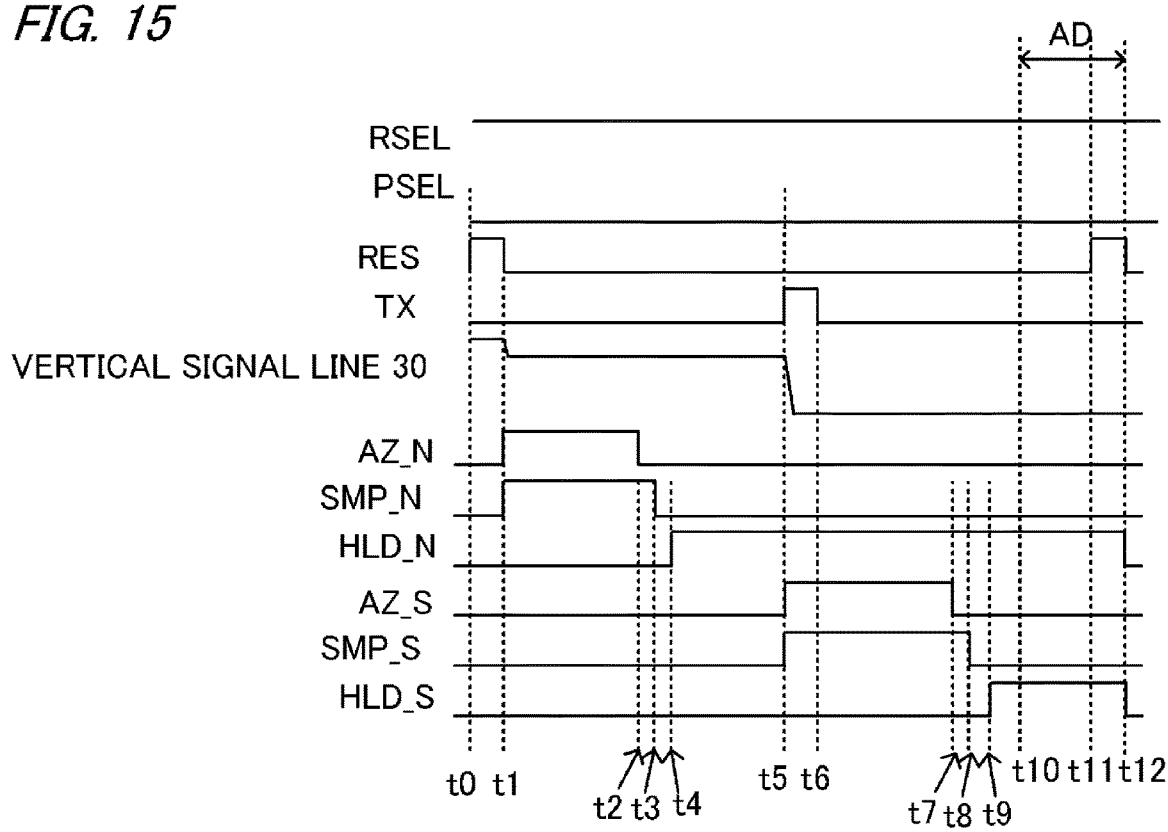
FIG. 15 is a timing chart of the photoelectric conversion apparatus according to Example 7.

FIGS. 13, 14 and 15 are a schematic diagram and timing charts of a photoelectric conversion apparatus according to Example 7. In the following, only the differences from FIGS. 11 and 12 of Example 6 will be described. FIG. 13 includes a capacitor 650 and switches 660, 670, 680, 690 and 700. Thereby not only the low noise operation mode similar to Example 6 but also the high-speed operation mode can be implemented.

Low Noise Operation Mode

FIG. 14 indicates a timing chart that is used when an operation similar to Example 6 is performed. As indicated in FIG. 14, the control signals AZ_S, SMP_S and HLD_S are at high level, low level and low level respectively. Therefore in FIG. 13, the switch 660 is in the ON state and the switches 670 and 680 are in the OFF state. When the control signal PSEL becomes high level and the control signal RSEL becomes low level, the switch 690 becomes the ON state and the switch 700 becomes the OFF state, although this is not indicated in the time chart in FIG. 14. Here the circuit in FIG. 13 becomes the operation state similar to FIG. 11, and the same operation as the time chart in FIG. 12 is implemented by the time chart in FIG. 14.

High-Speed Operation Mode

FIG. 15 indicates a timing chart that is used when a faster operation, than the operation in FIG. 14, is performed. According to this operation mode, when the control signal PSEL becomes low level and the control signal RSEL becomes high level, the switch 690 becomes the OFF state and the switch 700 becomes the ON state. Now aspects that are different from the time chart in FIG. 14 will be mainly described. In time t0 to t1, the control signal RES becomes high level and the reset transistor 455 turns ON, whereby the floating diffusion 420 is reset. Accordingly, the potential of the vertical signal line 30 becomes the reset level. At time t1, the control signal RES becomes low level and the reset transistor 455 turns OFF. Here the potential of the floating diffusion 420 decreases, hence the potential of the vertical signal line 30 also decreases.

After the potential of the vertical signal line 30 stabilizes, at time t2 the control signal AZ_N becomes low level and the switch 550 turns OFF. Then at time t3, the control signal SMP_N becomes low level and the switch 600 turns OFF, and at time t4, the control signal HLD_N becomes high level and the switch 610 turns ON. By this series of operations, the source potential of the P-type transistor 560 becomes the potential equivalent to the reset level of the vertical signal line 30. This reset level is a potential that includes: the kT/C noise generated in the pixel 10 when the control signal RES becomes low level and the reset transistor 455 turns OFF at time t1; and the threshold dispersion of the amplification transistor 430.

In time t5 to t6, the control signal TX becomes high level and the transfer transistor 410 turns ON, whereby the photoelectric charges are transferred from the photoelectric conversion element 400 to the floating diffusion 420. The potential of the floating diffusion 420 decreases as the quantity of the charges decreases. Thereby the potential of the vertical signal line 30 decreases. Further, at time t5, the control signals AZ_S and SMP_S become high level and the switches 660 and 670 turn ON. After the potential of the vertical signal line 30 stabilizes, the control signal AZ_S becomes low level and the switch 660 turns OFF at time t7. Then the control signal SMP_S becomes low level and the switch 670 turns OFF at time t8, and the control signal HLD_S becomes high level and the switch 680 turns ON at time t9. By this series of operations, the source potential of the P-type transistor 590 becomes a potential equivalent to the signal level of the vertical signal line 30.

At time t10, the AD conversion (AD) is started. When the signal voltage ΔV, corresponding to the difference of the source voltages between the P-type transistors 560 and 590, is generated on both ends of the variable resistor 580, the signal current of ΔI=ΔV/R (where R is a resistance value of the variable resistor 580) flows through the variable resistor 580 and is outputted to the conversion unit 60. Here both of the source voltages of the P-type transistors 560 and 590 include the kT/C noise generated in the pixel 10 and the threshold dispersion of the amplification transistor 430, hence the influence on the output current can be reduced.

Further, the control signals SMP_N and SMP_S are low level during the AD conversion period, hence the switches 600 and 670 are in the OFF state. Furthermore, the control signal PSEL is low level, hence the switch 690 is also in the OFF state. Thereby the vertical signal line 30 and the circuits inside the voltage-current conversion unit 50 are not connected electrically, and the next pixel read operation can be started during the AD conversion period. Specifically, in FIG. 15, the control signal RES becomes high level at time t11 during the AD conversion period, whereby the reset operation of the pixel is started. As described above, high-speed operation mode can also be implemented.

Further, in Example 7, the sample-and-hold circuit constituted of the operational amplifier 520, the capacitor 650 and the switches 670 and 680 is include inside the voltage-current conversion unit 50. This means that the sample-and-hold circuit exists on the path from the vertical signal line 30 to the conversion unit 60, but this sample-and-hold circuit is used only in the high-speed operation mode. In the case of the low noise operation mode indicated in FIG. 14, the operational amplifier 520 is operated as a buffer amplifier, and a signal of the vertical signal line 30 is sampled by the conversion unit 60 during a predetermined period. In other words, the circuit configuration in the low noise operation mode is a configuration equivalent to Example 6, that is, a configuration, where a path does not pass through the sample-and-hold circuit, exists between the vertical signal line 30 and the conversion unit 60. Therefore in the low noise operation mode, the pixel noise can be reduced, just like the above mentioned examples.

Example 8

Figure 16:
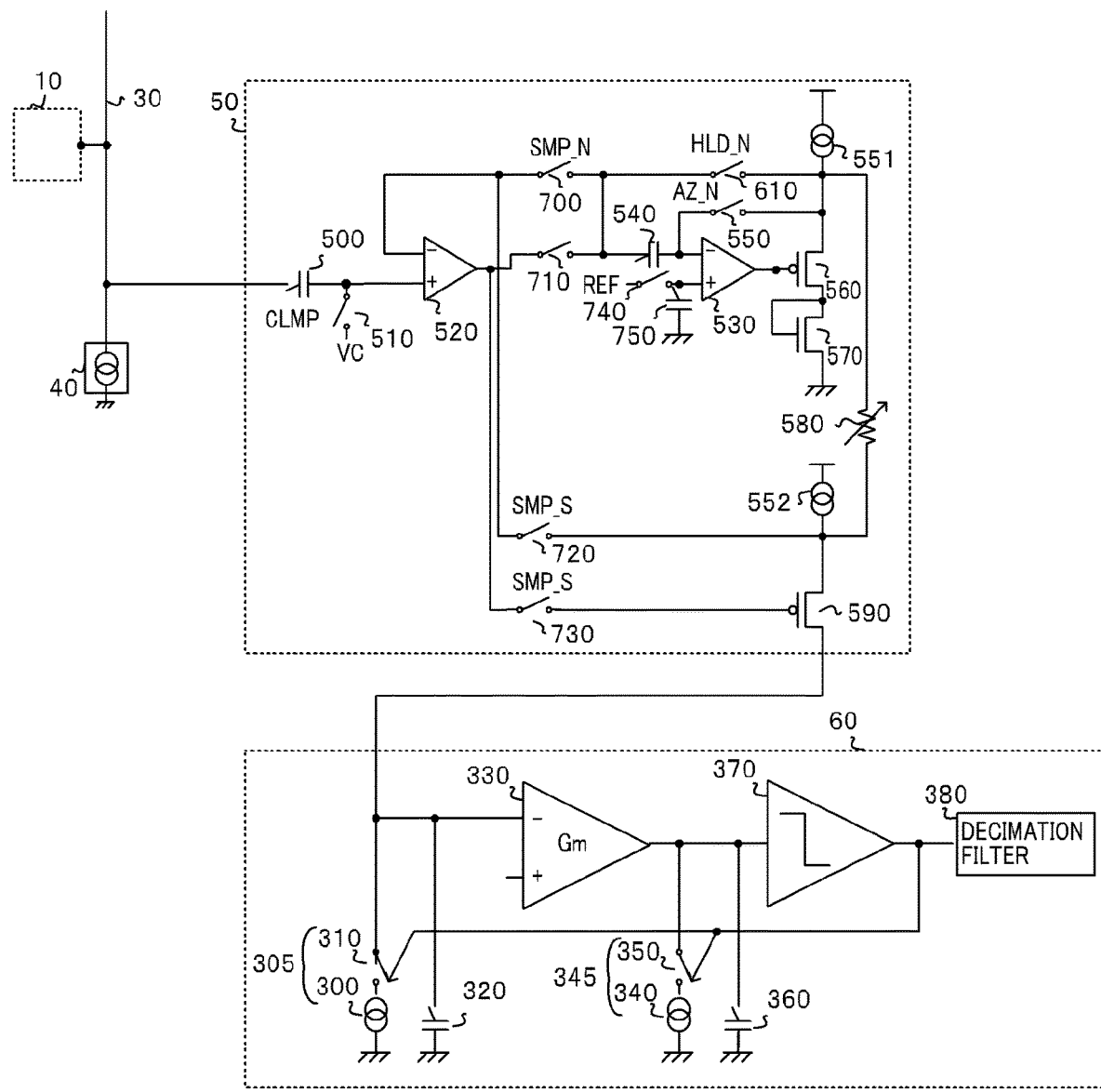
FIG. 16 is a schematic diagram of a photoelectric conversion apparatus according to Example 8.
Figure 17:
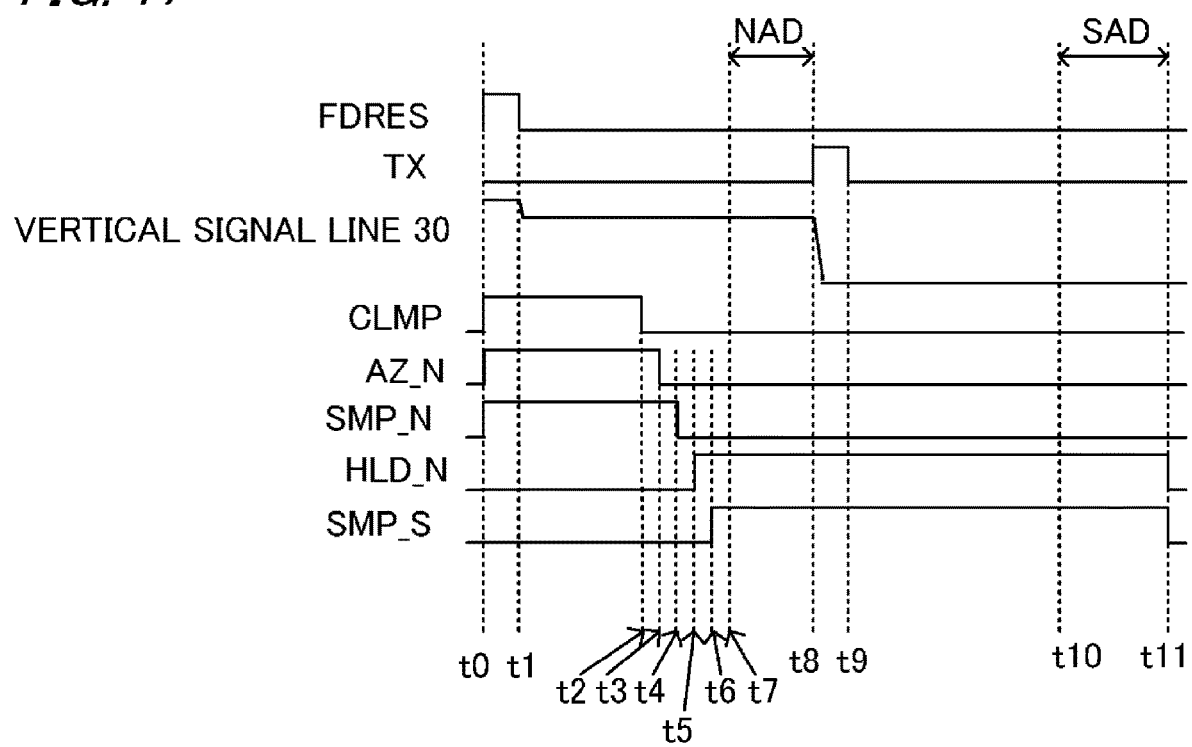
FIG. 17 is a timing chart of the photoelectric conversion apparatus according to Example 8.

FIGS. 16 and 17 are a schematic diagram and a timing chart of a photoelectric conversion apparatus according to Example 8. In the following, only the differences from FIGS. 11 and 12 of Example 6 will be described. FIG. 16 includes switches 700, 710, 720, 730 and 740 and a capacitor 750. In FIG. 11 of Example 6, the vertical signal line 30 is connected to the capacitor 540 via the switch 600, but in the circuit of Example 8, the capacitor 540 can be connected to the amplifier 520 via the switches 700 and 710. In other words, in this configuration, the output of the amplifier 520 can be inputted to the input of the amplifier 530. This means that the offset of the amplifier 520 can be reflected on the source potential of the P-type transistor 560. Thereby the influence of the offset of the amplifier 520 on the output current can be reduced.

Aspects that are different from the time chart in FIG. 12 will be mainly described with reference to the timing chart in FIG. 17. In time t0 to t1, the control signal RES becomes high level and the reset transistor 455 turns ON, whereby the floating diffusion 420 is reset. Accordingly, the potential of the vertical signal line 30 becomes reset level. At time t1, the control signal RES becomes low level and the reset transistor 455 turns OFF. Here the potential of the floating diffusion 420 decreases, hence the potential of the vertical signal line 30 also decreases.

After the potential of the vertical signal line 30 stabilizes, the control signal CLMP becomes low level and the switch 510 turns OFF. Then the voltage equivalent to the reset level of the vertical signal line 30 is clamped using the capacitor 500. Thereby the influence of the kT/C noise generated in the pixel 10, the threshold dispersion of the amplification transistor 430, and the like on the output current can be reduced.

At time t3, the control signal AZ_N becomes low level and the switch 550 turns OFF. Then at time t4, the control signal SMP_N becomes low level, the switches 700 and 710 turns OFF, and at time t5, the control signal HLD_N becomes high level and the switch 610 turns ON. By this series of operations, the source potential of the P-type transistor 560 becomes the potential determined by adding the offset of the amplifier 520 to the reference voltage VC. At time t6, the control signal SMP_S becomes high level, whereby the switches 720 and 730 turn ON. Thereby the source potential of the P-type transistor 590 also becomes the potential determined by adding the offset of the amplifier 520 to the reference voltage VC.

At time t7, the AD conversion (NAD) of the reset level is started. Here the offset of the amplifier 520 is superimposed on both the source potentials of the P-type transistors 560 and 590, hence the influence thereof on the output current can be reduced. Thereby the output current dispersion, when the resistance of the variable resistor 580 is decreased to apply gain to the output current in particular, can be reduced, and high gain operation can be implemented.

In time t8 to t9, the control signal TX becomes high level and the transfer transistor 410 turns ON, whereby the photoelectric charges are transferred from the photoelectric conversion element 400 to the floating diffusion 420. The potential of the floating diffusion 420 decreases as the quantity of the charges decreases. Thereby the potential of the vertical signal line 30 decreases. After the potential of the vertical signal line 30 stabilizes, the AD conversion (SAD) of the signal level of the vertical signal line 30 is started at time t10. The AD conversion results of the reset level and the signal level are sent to the data processing unit 90, and the difference thereof is determined, whereby the digital correlated double sampling (CDS) processing is performed.

As described above, in Example 8 as well, a path, which does not pass through the sample-and-hold circuit, exists between the vertical signal line 30 and the conversion unit 60, just like Example 6. Therefore in Example 8, a pixel signal can be sampled for a plurality of times in a state where the vertical signal line 30 is connected to the conversion unit 60 for a predetermined period, whereby the pixel noise can be reduced.

Figure 18:
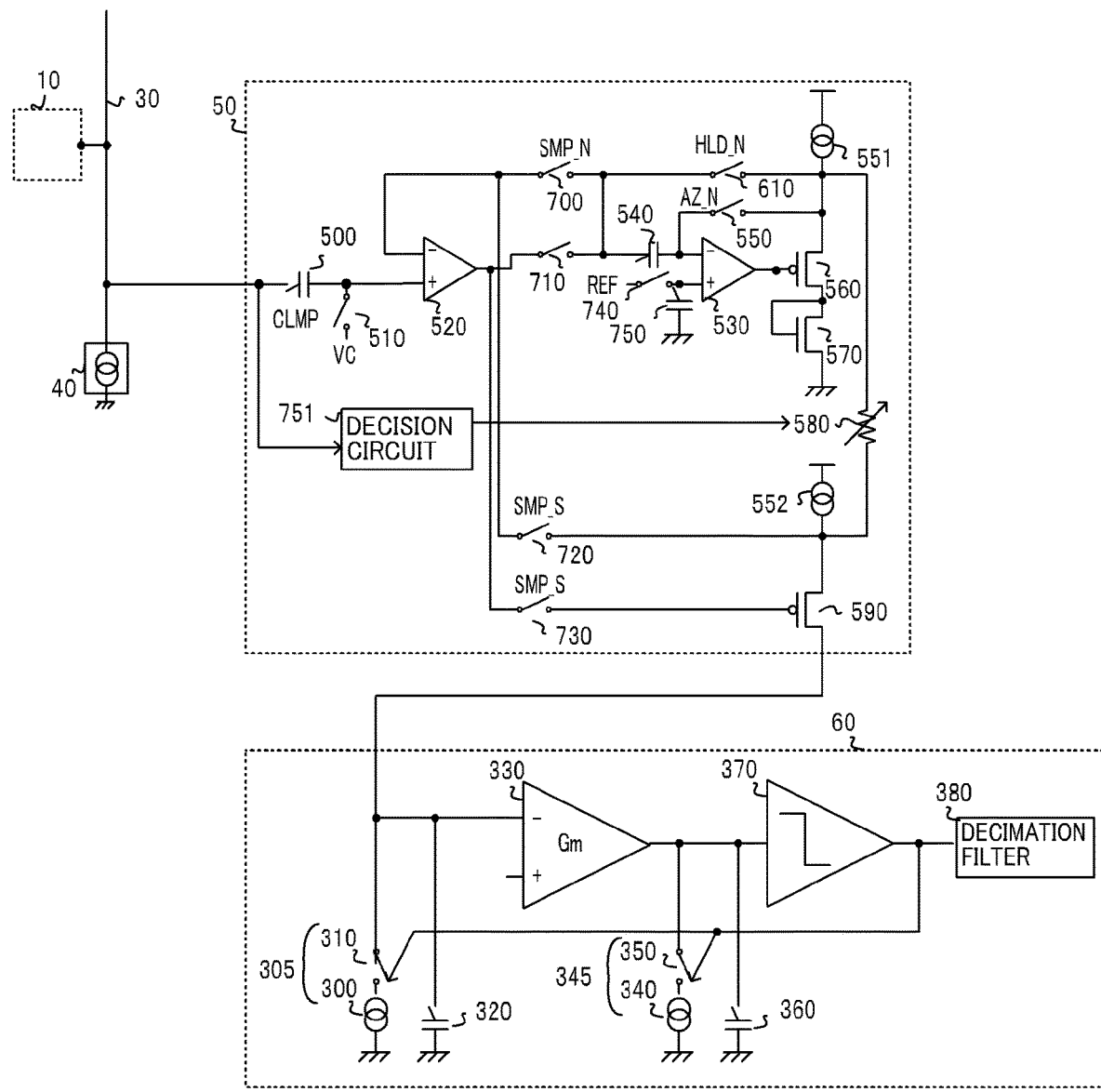
FIG. 18 is a schematic diagram of a photoelectric conversion apparatus according to a modification of Example 8.
Figure 19:
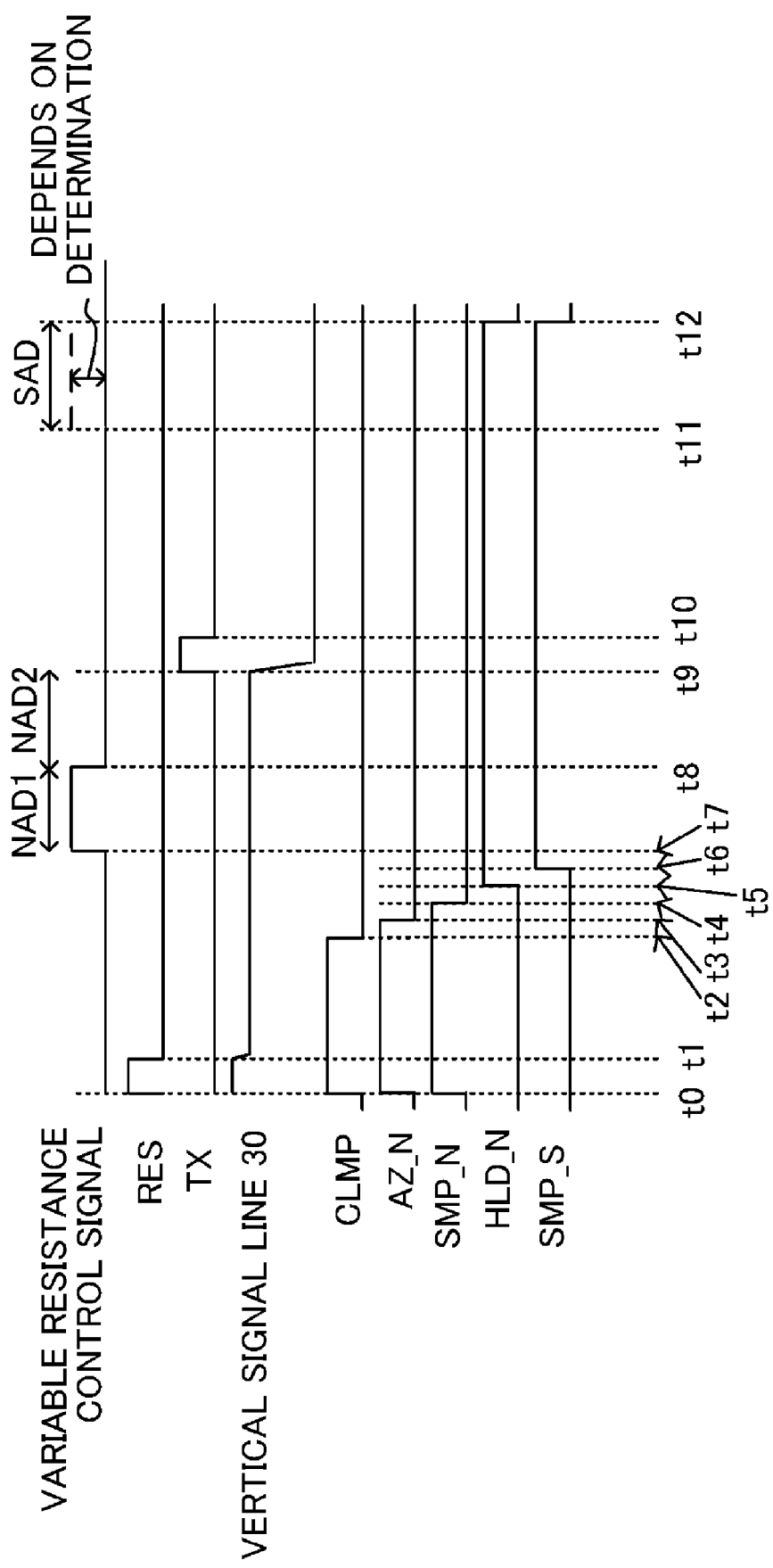
FIG. 19 is a timing chart of the photoelectric conversion apparatus according to the modification of Example 8.

As indicated in FIG. 18, a decision circuit 751 may be disposed so as to switch a resistance value of the variable resistor 580 in accordance with the amplitude of the vertical signal line 30. FIG. 19 is an operation example. A difference from FIG. 17 is that the AD conversion of the reset level is performed twice in time t7 to t9. For example, in the first NAD1, the AD conversion is performed in the state where the variable resistor 580 is set to the low resistance, and in the second NAD2, the AD conversion is performed in the state where the resistance resistor 580 is set to the high resistance. Then before the SAD started at time t11, the decision circuit 751 determines the amplitude of the vertical signal line 30, and the variable resistor 580 is set to high resistance if it is determined that the amplitude is high, or to low resistance if it is determined that the amplitude is low. Then in the case of the former, NAD2 and CDS are performed, and in the case of the latter, NAD1 and CDS are performed. By the above operation, deterioration of the CDS performance can be prevented while expanding the dynamic range.

Figure 20:
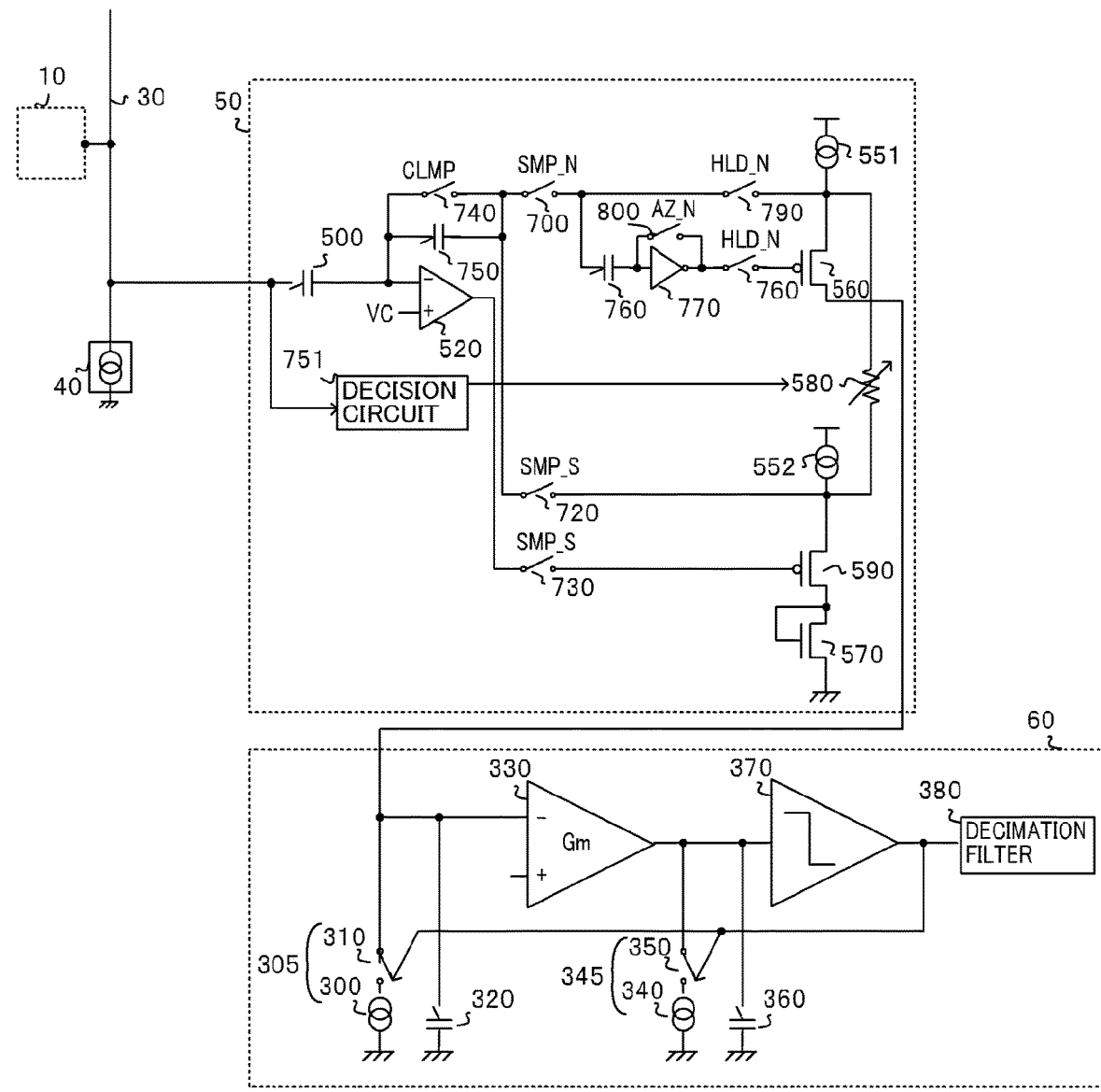
FIG. 20 is a schematic diagram of a photoelectric conversion apparatus according to a modification of Example 8.

Further, as indicated in FIG. 20, a single end amplifier 770 may be used instead of the operational amplifier 530. Thereby the circuit scale can be minimized. Furthermore, instead of configuring a non-inverting buffer amplifier using the operational amplifier 520, an inverting amplifier may be configured along with the capacitors 500 and 750. In this case, both the differential inputs of the operational amplifier 520 do not depend on the signal of the vertical signal line 30, that is, this configuration is advantageous to decrease voltage.

Figure 21:
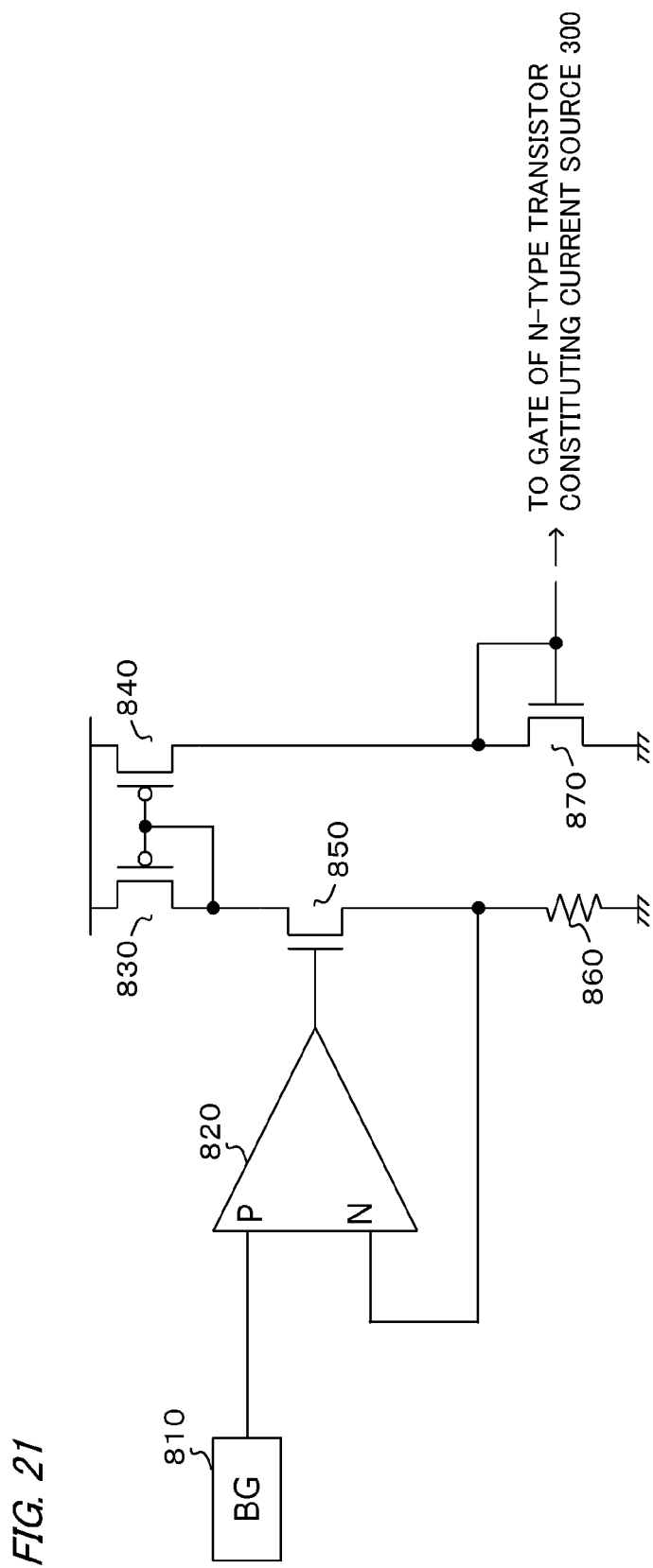
FIG. 21 is a schematic diagram of a photoelectric conversion apparatus according to a modification of Example 8.

Moreover, the bias voltage may be supplied to the conversion unit 60 using the bias circuit indicated in FIG. 21. In FIG. 21, 820 is an operational amplifier, 860 is a resistance element, 850 and 870 are N-type transistors, 830 and 840 are P-type transistors, and 810 is a band gap circuit. From the band gap circuit 810, an ≈1.2V voltage, of which dependency on temperature is extremely small, is outputted. Hence voltages on both ends of the resistance element 860 also become ≈1.2V, and the current that flows through the N-type transistors 850 and 870 and the P-type transistors 830 and 840 become 1.2/R. Here if the resistance of the resistance element 860 is the same type as that of the variable resistor 580, then the temperature dependency of the current of the variable resistor 580 is the same as the temperature dependency of the current flowing through the resistance element 860 and the N-type transistor 850. This means that the temperature dependency of the signal current flowing through the variable resistor 580 and the temperature dependency of the current value of the current source 300 can be linked and offset. Thereby the temperature dependency of the read gain can be reduced.

Figure 22:
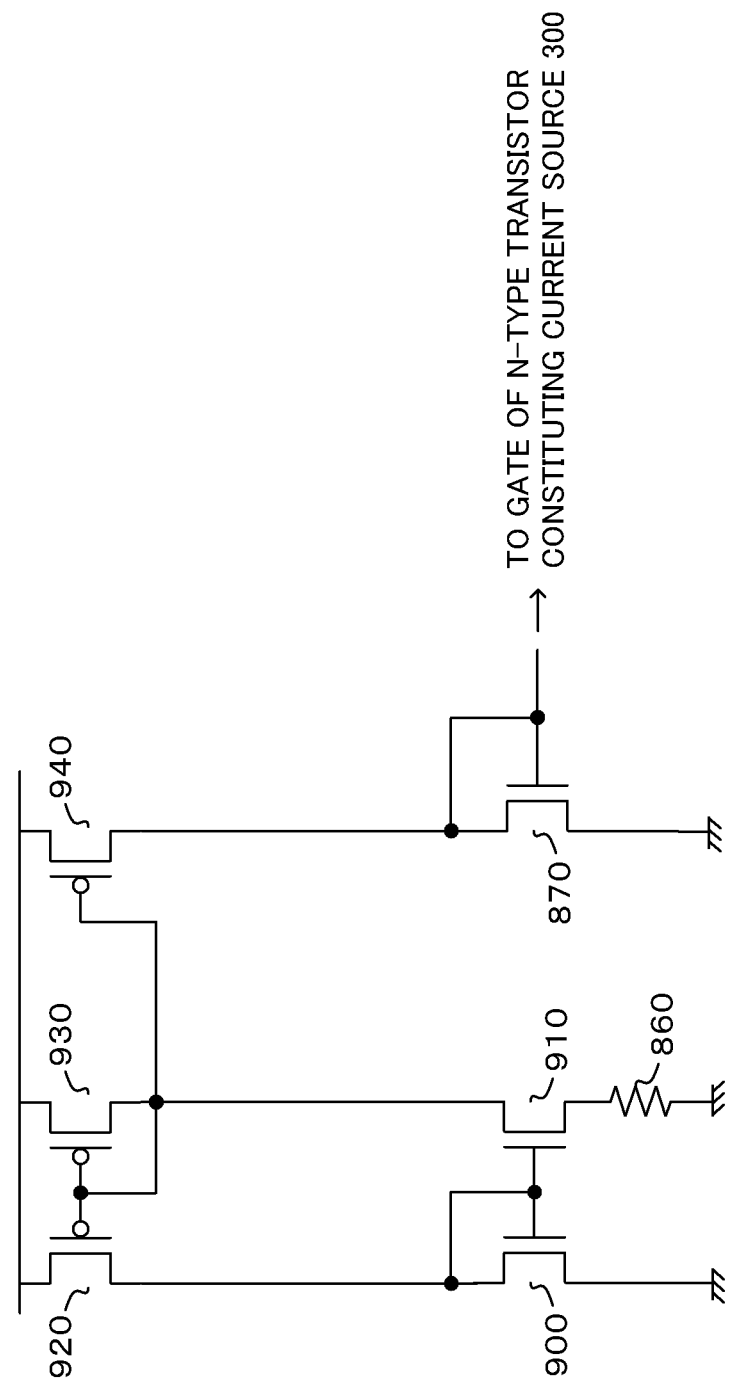
FIG. 22 is a schematic diagram of a photoelectric conversion apparatus according to a modification of Example 8.

The bias circuit in FIG. 21 is an example. For example, it is possible to link to the temperature dependency of the current resistance element of the N-type transistor 550 even if the bias circuit indicated in FIG. 22 is used.

The variable resistor 580 and the resistance element 860 can be constituted of a poly resistor, diffusion resistor, metal resistor, or the like.

It is desirable to dispose the variable resistor 580 and the resistance element 860 on the same substrate. Thereby the temperature dependency can be reduced with minimizing process dispersion.

Figure 23:
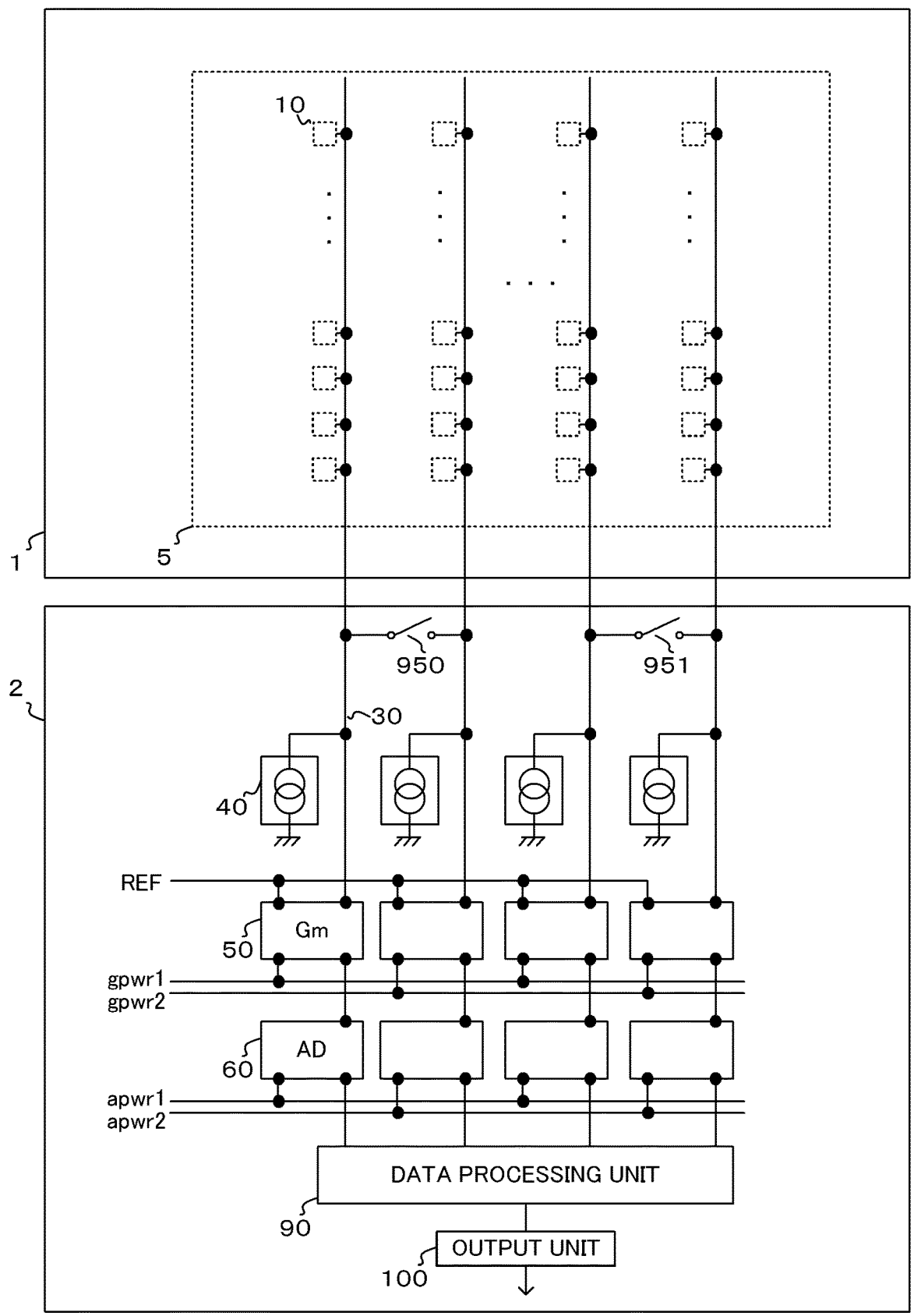
FIG. 23 is a schematic diagram of a photoelectric conversion apparatus according to a modification of Example 8.

A function to add (average) values among columns may be included. For example, as indicated in FIG. 23, switches 950 and 951, to short circuit signals on the vertical signal lines 30, may be disposed. In this case, as indicated in FIG. 23, the power control lines may be separated into odd columns and even columns (gpwr1, gpwr2) by the voltage-current conversion unit 50. In the same manner, the power control lines may be separated into odd columns and even columns (apwr1, apwr2) by the conversion units 60. Thereby when the addition between columns is performed, a number of the voltage-current conversion units 50 and a number of conversion units 60 that are operating can be decreased, and power can be saved.

Figure 24:
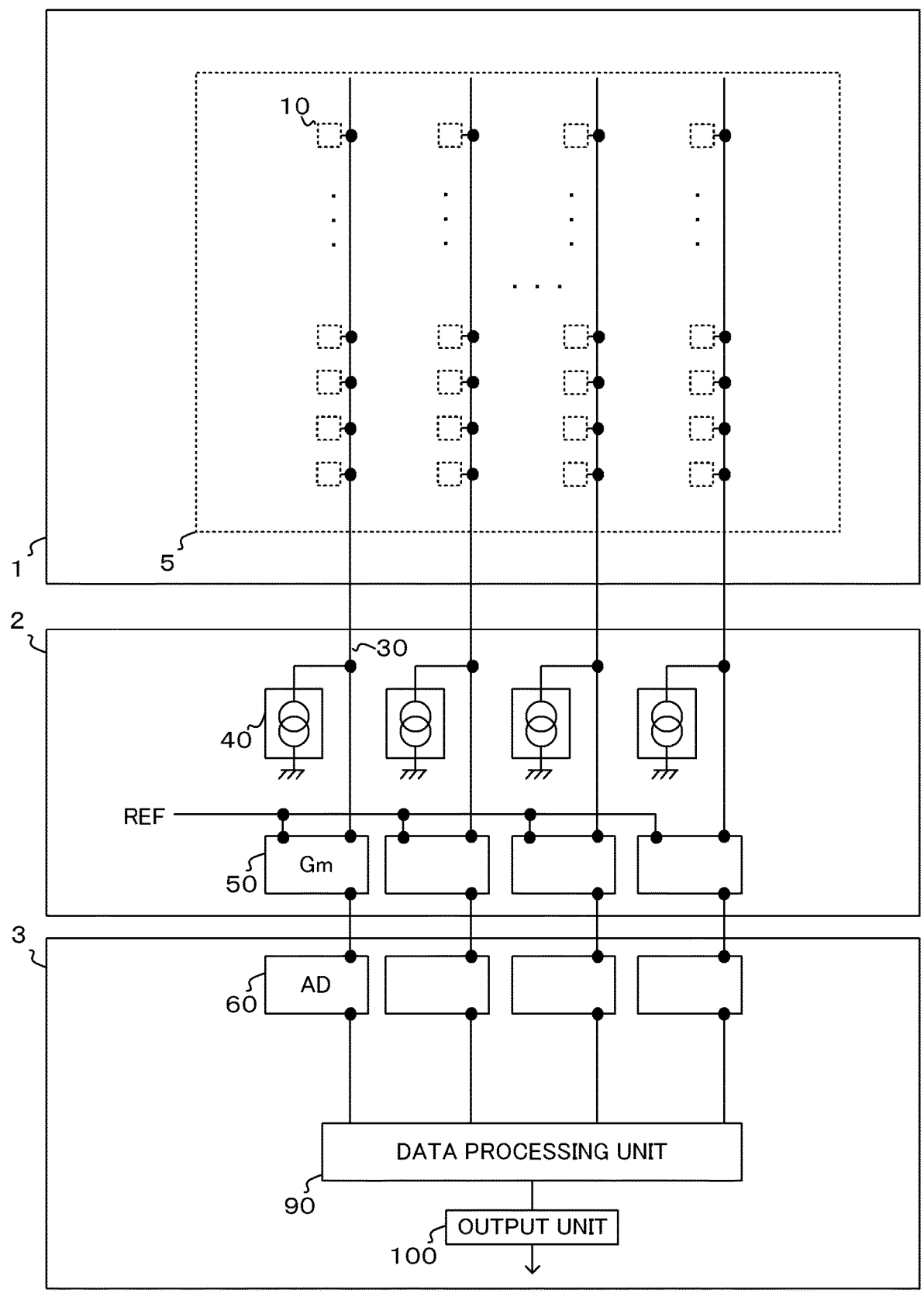
FIG. 24 is a schematic diagram of a photoelectric conversion apparatus according to a modification of Example 8.

Further, as indicated in FIG. 24, a second circuit board 3 may be disposed and may be in a three-layer stacked form. This allows the read circuits to be separated into the circuit board 2 and the second circuit board 3, whereby the chip size can be reduced, and narrow pitch problems of pixels 10 can be handled. FIG. 24 is an example, and modification thereof is possible, such as disposing part of the conversion unit 60 on the circuit board 2.

The form of the photoelectric conversion apparatus is not limited to the above examples. For example, the pixel 10 is not limited to that indicated in FIG. 2. The capacitance of the floating diffusion 420 may be configured to be switchable. The pixel 10 may have a form such that a plurality of photoelectric conversion elements 400 share the floating diffusion 420. A plurality of photoelectric conversion elements 400 may be formed under a same micro lens, so that the phase difference may be detected in the pixel. Furthermore, in the case where a plurality of vertical signal lines 30 are included in one pixel column, a plurality of selection transistors 440 may be included. Furthermore, instead of the electron storage type pixel, a hole storage type pixel may be used. Instead of the pixel using the source-follower, a type of pixel that outputs using the source grounding amplification circuit or differential amplification circuit may be used.

Example 9

Figure 25:
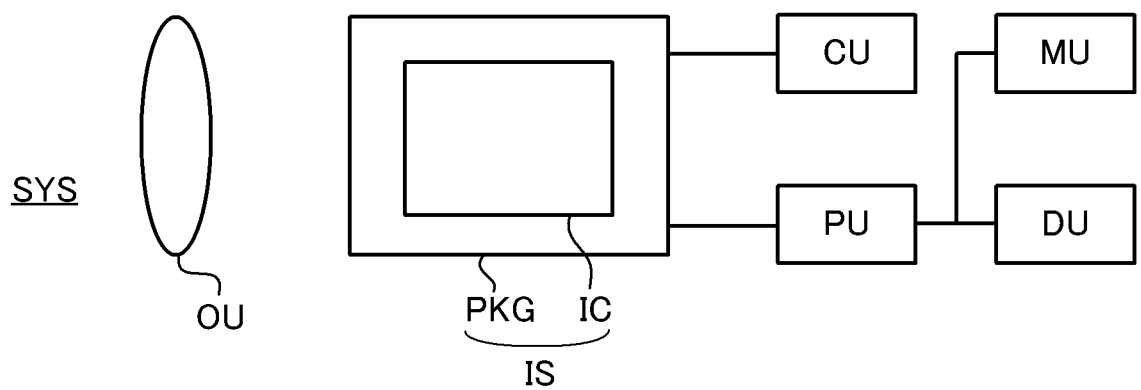
FIG. 25 is a schematic diagram of a photoelectric conversion system according to Example 9.

A photoelectric conversion system according to Example 9 will be described with reference to FIG. 25. FIG. 25 is a block diagram depicting a general configuration of the photoelectric conversion system according to Example 9.

The photoelectric conversion apparatuses described in Example 1 to 8 are applicable to various photoelectric conversion systems. The photoelectric conversion system in Example 9 includes at least: the photoelectric conversion apparatus according to any of the above mentioned examples; and a signal processing unit that processes signals outputted from the photoelectric conversion apparatus. Examples of equipment to which a photoelectric conversion system can be applied are a digital still camera, a digital camcorder, a monitoring camera, a copier, a facsimile, a portable telephone, an on-vehicle camera, an observation satellite, a sensor, and a measuring instrument. A camera module constituted of an optical system (e.g. lenses) and an imaging apparatus is also included in the equipment to which the photoelectric conversion system is applied. FIG. 25 indicates a block diagram of a digital still camera as an example of these equipment.

FIG. 25 is an example of a configuration of an imaging system SYS constructed using an imaging apparatus IS. The imaging system SYS is a camera or an information terminal having an image capturing function. The imaging apparatus IS may further include a package PKG containing an imaging device IC. The package PKG may include a base on which the imaging device IC is fixed, a cover facing the imaging device IC, and a connection member that connects a terminal disposed on the base and a terminal disposed on the imaging device IC. In the imaging apparatus IS, a plurality of imaging device ICs may be mounted side-by-side on a common package PKG. Further, in the imaging apparatus IS, an imaging device IC and other semiconductor devices may be stacked and mounted on a common package PKG.

The imaging system SYS may include an optical system OU that forms an image on the imaging apparatus IS. Further, the imaging system SYS may include at least one of a control device CU, a processing device PU, a display device DU, and a storage device MU. The control device CU is a device to control the imaging apparatus IS, and the processing device PU is a device to process a signal acquired from the imaging apparatus IS. The display device DU is a device to display an image acquired from the imaging apparatus IS, and the storage device MU is a device to store an image acquired from the imaging apparatus IS.

Example 10

Figure 26A:
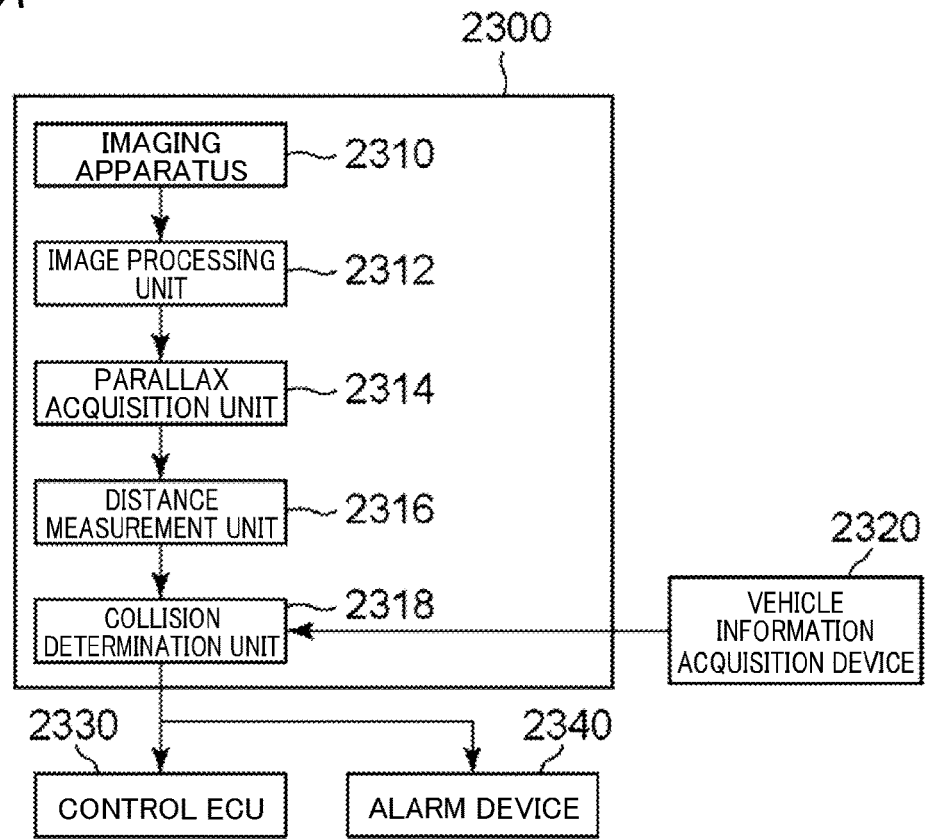
FIGS. 26A and 26B are schematic diagrams of a photoelectric conversion system according to Example 10.
Figure 26B:
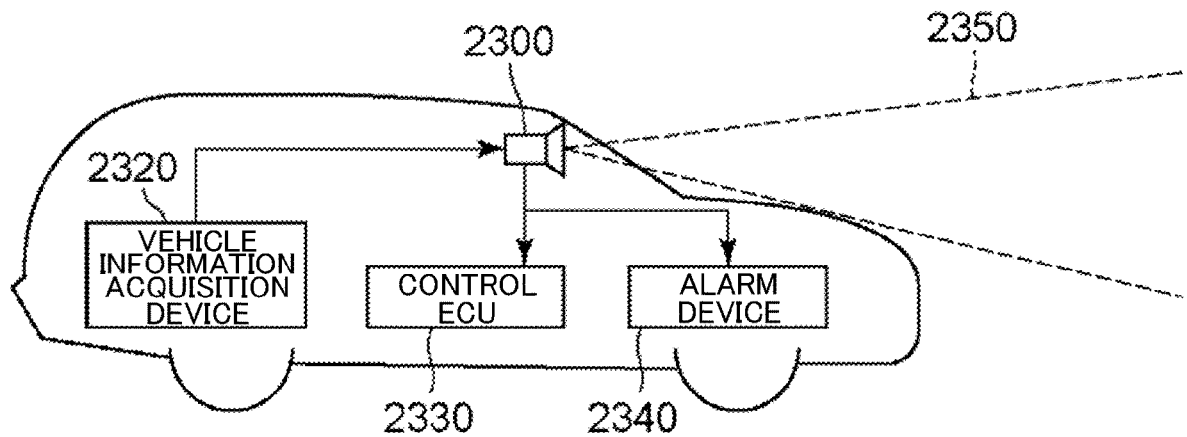

A device, to which the photoelectric conversion system of Example 10 is applied, will be described with reference to FIGS. 26A and 26B. FIGS. 26A and 26B are diagrams indicating the configuration of the photoelectric conversion system and the equipment of Example 10.

FIG. 26A indicates an example of the photoelectric conversion system related to an onboard camera. The photoelectric conversion system 2300 includes an imaging apparatus 2310. The imaging apparatus 2310 is a photoelectric conversion apparatus according to any one of the above examples. The photoelectric conversion system 2300 includes: an image processing unit 2312 that performs image processing on a plurality of image data acquired by the imaging apparatus 2310; and a parallax acquisition unit 2314 that calculates a parallax (phase difference of parallax images) based on a plurality of image data acquired by the photoelectric conversion system 2300. The photoelectric conversion system 2300 also includes: a distance measurement unit 2316 that calculates a distance to the subject based on the calculated parallax; and a collision determination unit 2318 that determines whether collision is possible based on the calculated distance. Here the parallax acquisition unit 2314 and the distance measurement unit 2316 are examples of distance information acquisition means for acquiring distance to the subject. In other words, the distance information is information on the parallax, defocus amount, distance to the subject, and the like. The collision determination unit 2318 may determine the collision probability using any of this distance information. The distance information acquisition means may be implemented by dedicated hardware or may be implemented by software modules. The distance information acquisition means may also be implemented by a field programmable gate array (FPGA), an application specific integrated circuit (ASIC), or the like, or by a combination thereof.

The photoelectric conversion system 2300 is connected to a vehicle information acquisition device 2320, whereby such vehicle information as vehicle speed, yaw rate and steering angle can be acquired. Further, a control ECU 2330, which is a control unit to output a control signal to generate a braking force to a vehicle based on the determination result of the collision determination unit 2318, is connected to the photoelectric conversion system 2300. The photoelectric conversion system 2300 is also connected to an alarm device 2340 that emits an alarm to the drive based on the determination result of the collision determination unit 2318. For example, in a case where the collision probability is high based on the determination result of the collision determination unit 2318, the control ECU 2330 performs vehicle control to prevent collision and to minimize damage by braking, slowing acceleration, reducing engine output, or the like. The alarm device 2340 emits an alarm to the user by sounding an alarm, displaying alarm information on a screen of the car navigation system or the like, or applying vibration to the seat belt or steering wheel, for example.

In Example 10, the surroundings of the vehicle, such as a front area or a rear area, is imaged by the photoelectric conversion system 2300. FIG. 26B indicates the photoelectric conversion system 2300 in the case of imaging the front area of the vehicle (imaging range 2350). The vehicle information acquisition device 2320 sends an instruction to the photoelectric conversion system 2300 or to the imaging apparatus 2310. By this configuration, the accuracy of the distance measurement can be further improved.

In the above described example, the photoelectric conversion system controls to avoid collision with another vehicle, but also be applied to an automatic driving control to follow another vehicle, or an automatic driving control for the vehicle to avoid deviating from a lane. Further, the photoelectric conversion system can be applied not only to a vehicle, such as an automobile, but also to a ship, an airplane or to such a moving body (moving apparatus) as an industrial robot. Additionally, the photoelectric conversion system can be applied not only to moving bodies but also to a wide range of equipment that recognize objects, such as an intelligent transport system (ITS).

Example 11

Figure 27:
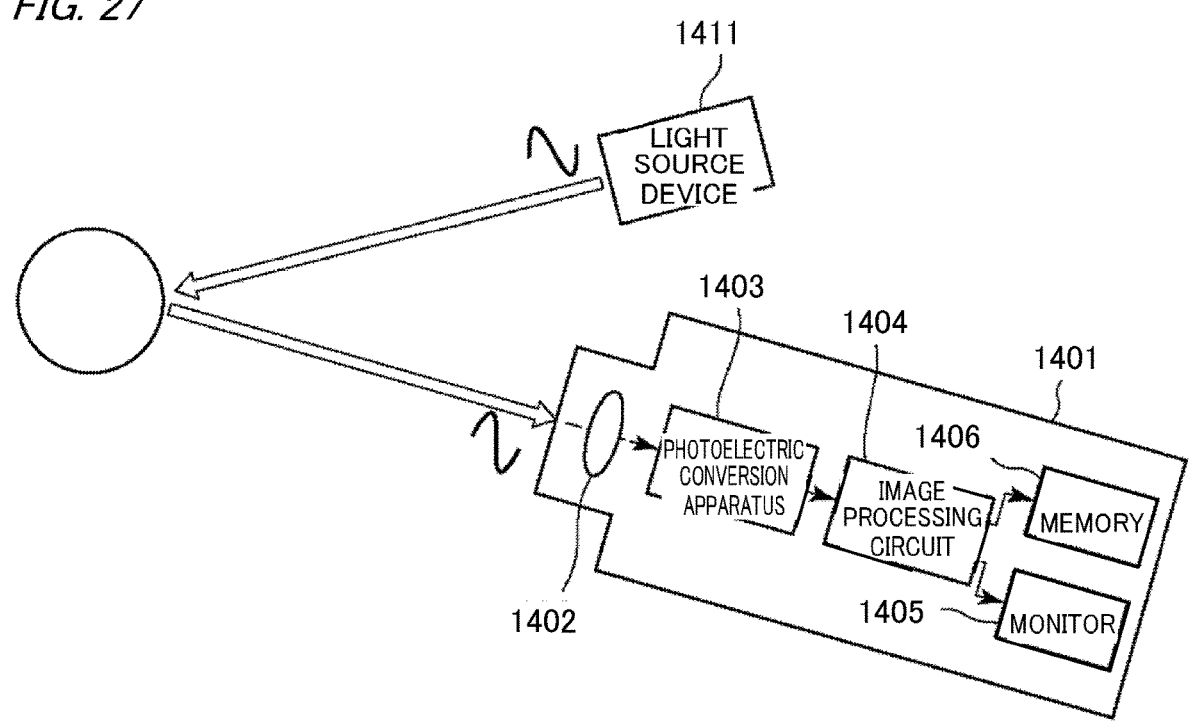
FIG. 27 is a schematic diagram of a photoelectric conversion system according to Example 11.

A device to which the photoelectric conversion system is applied according to Example 11 will be described with reference to FIG. 27. FIG. 27 is a block diagram depicting a configuration example of a distance image sensor, which is an example of equipment to which the photoelectric conversion system of Example 11 is applied.

As illustrated in FIG. 27, a distance image sensor 1401 is constituted of an optical system 1402, a photoelectric conversion apparatus 1403, an image processing circuit 1404, a monitor 1405 and a memory 1406. The distance image sensor 1401 receives the light which is emitted from a light source device 1411 to the subject, and is reflected on the surface of the subject (modulated light, pulsed light), whereby a distance image in accordance with the distance to the subject can be acquired.

The optical system 1402, which is constituted of one or a plurality of lenses, guides the image light (incident light) from the subject to the photoelectric conversion apparatus 1403, and forms an image on a light-receiving surface (sensor unit) of the photoelectric conversion apparatus 1403.

For the photoelectric conversion apparatus 1403, the photoelectric conversion apparatus of any one of the above mentioned examples may be applied, and a distance signal, which indicates the distance determined based on a light-receiving signal outputted from the photoelectric conversion apparatus 1403, is supplied thereby to the image processing circuit 1404.

The image processing circuit 1404 performs image processing to construct a distance image based on the distance signal supplied from the photoelectric conversion apparatus 1403. The distance image (image data) acquired by this image processing is supplied to the monitor 1405 and displayed thereon, or is supplied to the memory 1406 and stored (recorded) therein.

In the distance image sensor 1401 configured like this, a more accurate distance image can be acquired by applying the above mentioned photoelectric conversion apparatus.

Example 12

Figure 28:
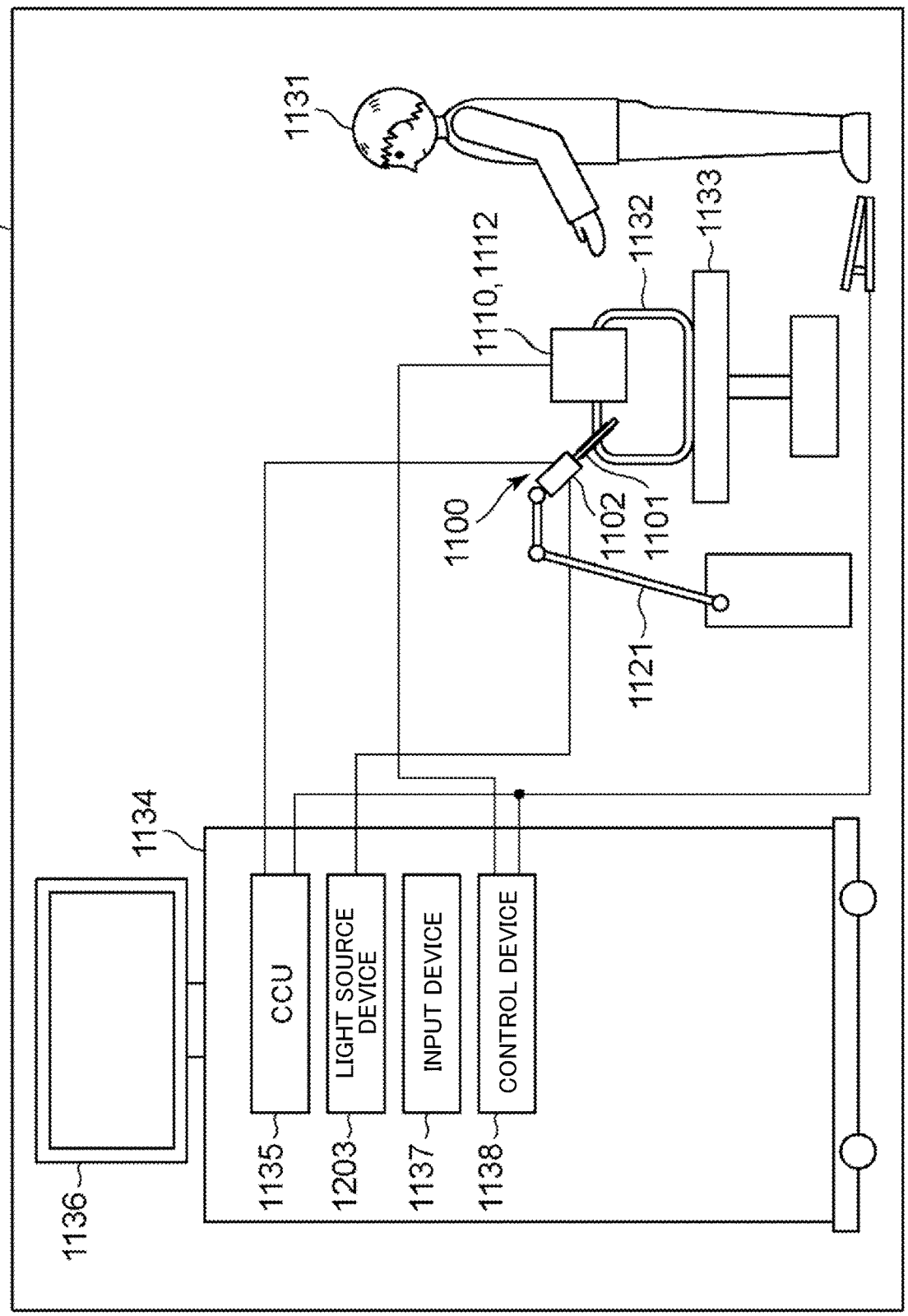
FIG. 28 is a schematic diagram of a photoelectric conversion system according to Example 12.

Equipment to which the photoelectric conversion system is applied according to Example 12 will be described with reference to FIG. 28. FIG. 28 is a diagram indicating an example of a general configuration of an endoscopic surgery system, which is equipment to which the photoelectric conversion system in Example 12 is applied.

In FIG. 28, an operator (physician) 1131 is performing surgery on a patient 1132 lying on a patient bed 1133, using an endoscopic surgery system 1003. As illustrated here, the endoscopic surgery system 1003 is constituted of an endoscope 1100, a surgical instrument 1110, and a cart 1134 on which various devices for the endoscopic surgery are installed.

The endoscope 1100 is constituted of: a lens barrel 1101 of which a predetermined length of a region from the tip is inserted into the body of the patient 1132; and a camera head 1102 which is connected at the base end of the lens barrel 1101. In the illustrated example, the endoscope 1100 is configured as a hard mirror which has a hard lens barrel 1101, but the endoscope 1100 may be configured as a soft mirror having a soft lens barrel.

An opening in which an objective lens is fitted is disposed at the tip of the lens barrel 1101. A light source device 1203 is connected to the endoscope 1100. Light generated by the light source device 1203 is guided to the tip of the lens barrel via a light guide which is extended inside the lens barrel 1101, and is emitted to the observation target inside the body of the patient 1132 through the objective lens. The endoscope 1100 may be a direct viewing type, or an oblique or side viewing type.

An optical system and a photoelectric conversion apparatus are disposed inside the camera head 1102, and reflected light (observation light) from the observation target is collected to the photoelectric conversion apparatus by this optical system. The observation light is photoelectrically converted by the photoelectric conversion apparatus, whereby electric signals corresponding to the observation light (image signals corresponding to the observed image), are generated. For this photoelectric conversion apparatus, the photoelectric conversion apparatus according to any one of the above described examples can be used. The image signals are sent to a camera control unit (CCU) 1135 as RAW data.

The CCU 1135 is constituted of a central processing unit (CPU), a graphics processing unit (GPU) and the like, and comprehensively controls the operations of the endoscope 1100 and the display device 1136. The CCU 1135 receives image signals from the camera head 1102, and performs various image processing, such as developing processing (demosaic processing), on the image signals so as to display an image based on the image signals.

By the control from the CCU 1135, the display device 1136 displays an image based on the image signals generated by the CCU 1135 performing the image processing.

The light source device 1203 is constituted of such a light source as a light-emitting diode (LED), and supplies illumination light to the endoscope 1100 when the surgical region or the like is imaged.

The input device 1137 is an input interface of the endoscopic surgery system 1003. The user can input various information and input instructions to the endoscopic surgery system 1003 via the input device 1137.

The control device 1138 controls the driving of an energy treatment instrument 1112 for cauterization and dissection of tissue, sealing of blood vessels, or the like.

The light source device 1203, which supplies the illumination light to the endoscope 1100 when a surgical region is imaged, may be constituted of an LED, a laser light source or a white light source configured by a combination thereof. In a case where a white light source is configured by a combination of RGB laser light sources, the output intensity and the output timing of each color (each wavelength) of light can be accurately controlled, hence the white balance of a captured image can be adjusted in the light source device 1203. Further, in this case, it is also possible to emit a laser light from each of the RGB laser light sources to the observation target by time division, and control the driving of an image pickup element of the camera head 1102 synchronizing with the emission timing, so as to capture an image corresponding to each RGB laser light source in time division. According to this method, a color image can be acquired even if a color filter is not disposed on the image pickup element.

Driving of the light source device 1203 may be controlled such that the intensity of the output light is changed at every predetermined time. Here synchronizing with the timing at which the intensity of the light is changed, the driving of the image pickup element of the camera head 1102 is controlled so as to acquire images by time division, and these images are combined, then an image at high dynamic range, free from overexposure or under exposure, can be generated.

The light source device 1203 may be configured such that light, in a predetermined wavelength band corresponding to the special light observation, can be supplied. In the special light observation, dependency of the light absorption in the body tissue on the wavelength is utilized. Specifically, by emitting light in a narrower band than the illumination light (white light) in normal observation, a predetermined tissue, such as blood vessels of a mucous membrane surface layer, is imaged at high contrast. In the special light observation, fluorescent observation, in which images are acquired by fluorescent light generated when the excitation light is emitted, may be performed. In the fluorescent observation, the excitation light is emitted to a body tissue and fluorescent light from the body tissue is observed, or such a reagent as indocyanine green (ICG) is locally injected into body tissue, and an excitation light corresponding to the fluorescent wavelength of the reagent is emitted to this body tissue, whereby a fluorescent image is acquired, for example. The light source device 1203 may be configured such that the narrow band light and/or excitation light corresponding to the special light observation can be supplied.

Example 13

Equipment to which the photoelectric conversion system is applied according to Example 13 will be described with reference to FIGS. 29A and 29B.

Figure 29A:
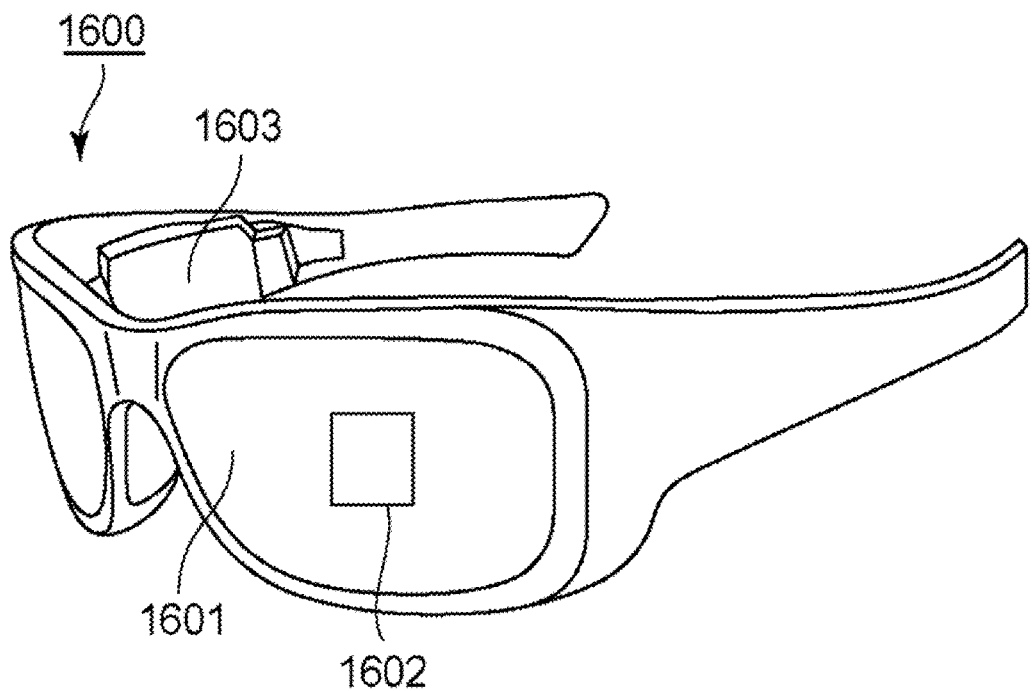
FIGS. 29A and 29B are schematic diagrams of a photoelectric conversion system according to Example 13.

FIG. 29A indicates glasses 1600 (smart glasses), which is equipment to which the photoelectric conversion system of Example 13 is applied. The glasses 1600 include a photoelectric conversion apparatus 1602. The photoelectric conversion apparatus 1602 is the photoelectric conversion apparatus according to any one of the above described examples. A display device, which includes such light emitting devices as OLED or LED, may be disposed on the rear face side of the lens 1601. A number of the photoelectric conversion apparatuses 1602 that are disposed may be one or may be 2 or more. A plurality of types of photoelectric conversion apparatuses may be combined. The position, at which the photoelectric conversion apparatus 1602 is described, is not limited to the position in FIG. 29A.

The glasses 1600 further include a control device 1603. The control device 1603 functions as a power supply that supplies power to the photoelectric conversion apparatus 1602 and the above mentioned display device. The control device 1603 also controls operations of the photoelectric conversion apparatus 1602 and the display device. Furthermore, the control device 1603 functions as a signal processing unit that processes signals outputted from the photoelectric conversion apparatus 1602. On the lens 1601, an optical system that collects light to the photoelectric conversion apparatus 1602 is formed.

Figure 29B:
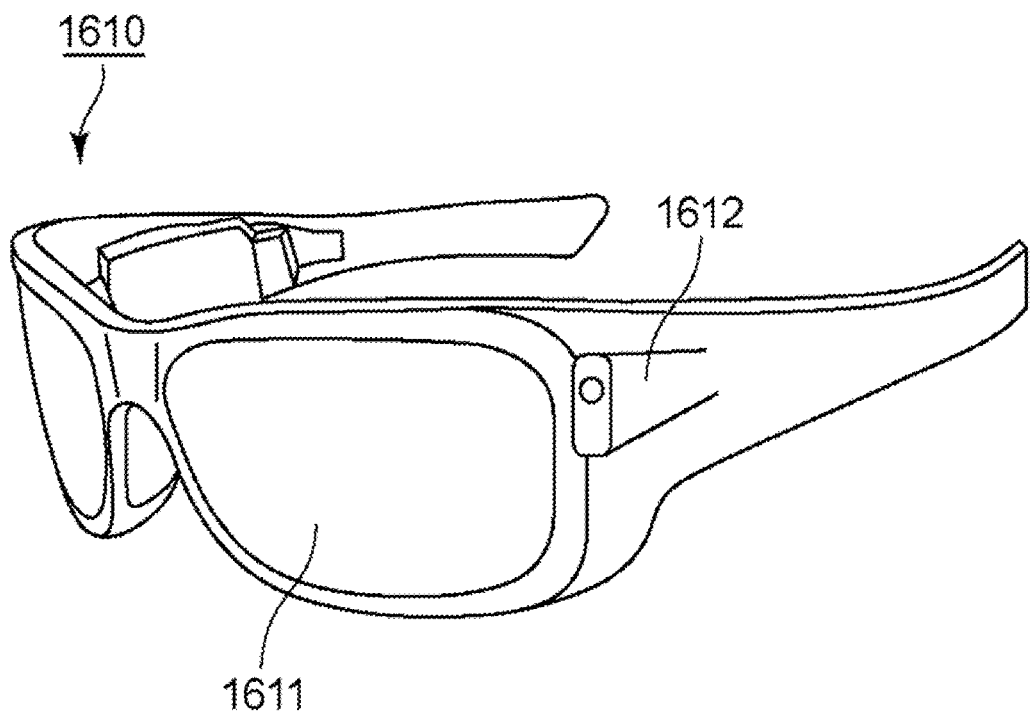

FIG. 29B indicates glasses 1610 (smart glasses), which is equipment to which the photoelectric conversion system of Example 13 is applied. This photoelectric conversion system is disposed at a different position from FIG. 29A. The glasses 1610 include a control device 1612. On the control device 1612, a photoelectric conversion apparatus, which is equivalent to the photoelectric conversion apparatus 1602, and the display device, are mounted. In the lens 1611, the photoelectric conversion apparatus (inside the control device 1612) and an optical system to project light emitted from the display device are formed, and an image is projected onto the lens 1611. The control device 1612 functions as a power supply that supplies power to the photoelectric conversion apparatus and the display device, and also controls operation of the photoelectric conversion apparatus and the display device. The control device 1612 may include a line-of-sight detection unit that detects a line-of-sight of a user. The line-of-sight may be detected using infrared rays. An infrared light-emitting unit emits infrared light to an eyeball of the user gazing at the display image. A reflected light of the emitted infrared light reflected from the eyeball is detected by an imaging unit, which includes a light-receiving element, whereby an image of the eyeball is captured. Since a means for reducing the light in the direction from the infrared light-emitting unit to the display unit (in planar view) is included, a drop in image quality is reduced.

The line-of-sight of the user to the display image is detected from the image of the eyeball captured by imaging with the infrared light. Any known method can be used to detect the line-of-sight using the image of the eyeball. For example, a line-of-sight detection method using a purkinje image generated by the reflection of the illumination light on the cornea, may be used.

In concrete terms, the line-of-sight detection processing based on the pupil corneal reflex method is performed. Using the pupil corneal reflex method, the line-of-sight of the user is detected by calculating the line-of-sight vector, which indicates the orientation of the eyeball (rotation angle), based on the image of the pupil and the purkinje image included in the captured image of the eyeball.

The display device of Example 13 may have the photoelectric conversion apparatus which includes a light-receiving element, so that the display image on the display device is controlled based on the information on the line-of-sight of the user received from the photoelectric conversion apparatus.

Specifically, on the display device, a first visual field region at which the user gazes and a second visual field region, which is a region, other than the first visual field region, are determined based on the line-of-sight information. The first visual field region and the second visual field region may be determined by the control device of the display device, or information determined by an external control device may be received. On the display region of the display device, the display resolution of the first visual field region may be controlled to be higher than the display resolution of the second visual field region. In other words, the resolution of the second visual field region may be controlled to be lower than the first visual field region.

The display region may include a first display region and a second display region which is different from the first display region, so that a region having higher priority is determined, out of the first display region and the second display region, based on the line-of-sight information. The first display region and the second display region may be determined by the control device of the display device, or information determined by an external control device may be received. The resolution of the region having a high priority may be controlled to be higher than the resolution of the region other than the region having a high priority. In other words, the resolution of a region having relatively low priority may be controlled to be lower.

AI may be used to determine the first visual field region and the region having high priority. AI may be a model configured to estimate an angle of a line-of-sight and a distance to a target subject to which the line-of-sight is detected, based on the image of the eyeball, using the image of the eyeball and the direction in which the eyeball of the image was actually viewing as teach data. The AI program may be owned by the display device, by the photoelectric conversion apparatus, or by an external device. In the case where an external device owns the AI program, the AI program is transferred to the display device via communication.

In the case of controlling the display based on the visual detection, the present invention can be preferably applied to smart glasses, which further includes a photoelectric conversion apparatus that captures an external image. The smart glasses can display the captured external information in real-time.

Example 14

The above mentioned photoelectric conversion apparatus and photoelectric conversion system may be applied to such electronic equipment as a smartphone and a tablet, for example.

Figure 30A:
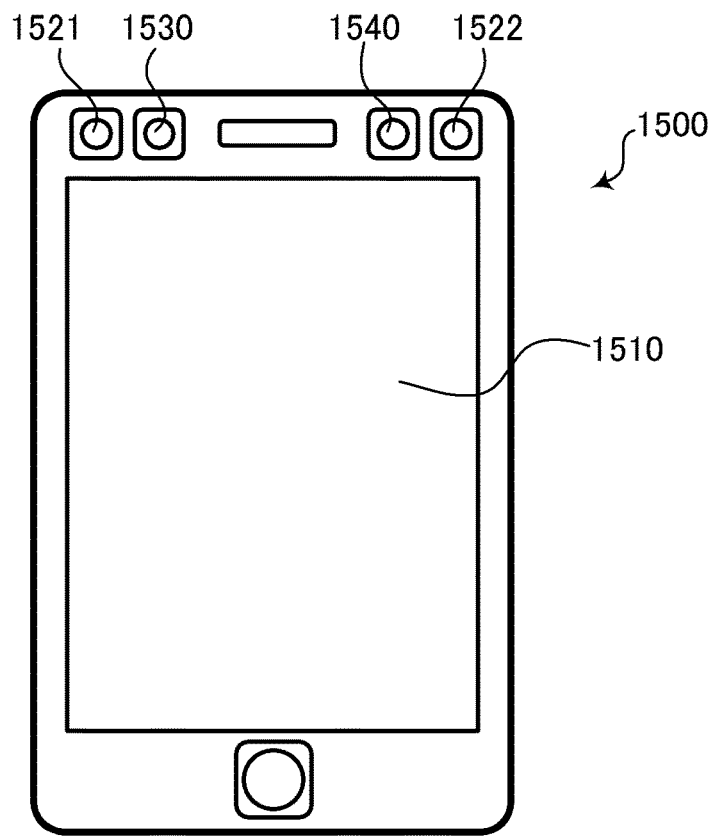
FIGS. 30A and 30B are schematic diagrams of a photoelectric conversion system according to Example 14.
Figure 30B:
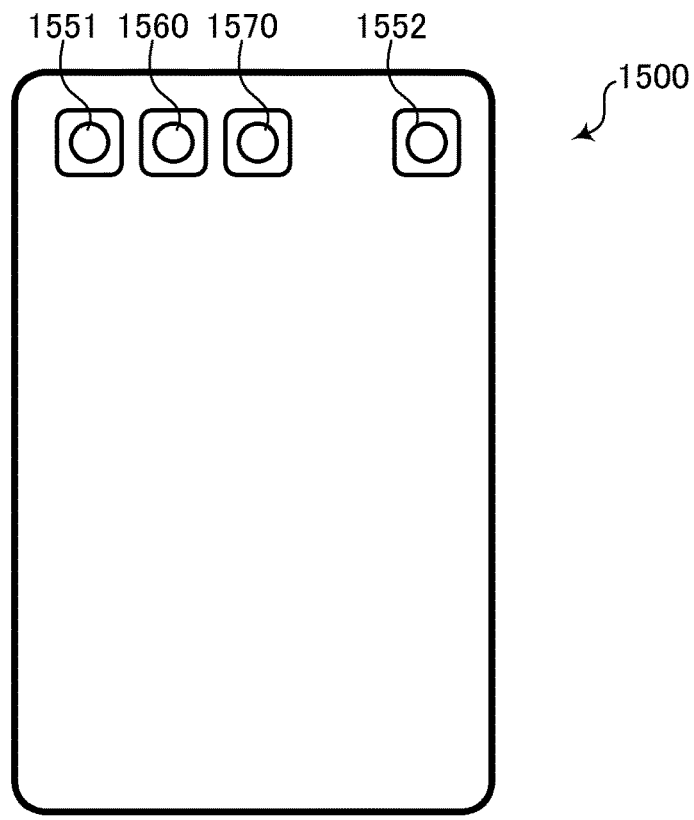

FIGS. 30A and 30B are diagrams indicating an example of electronic equipment 1500 on which the photoelectric conversion apparatus is installed. FIG. 30A indicates a front face side of the electronic equipment 1500, and FIG. 30B indicates a rear face side of the electronic equipment 1500.

As indicated in FIG. 30A, a display 1510, to display an image, is disposed at the center of the front face of the electronic equipment 1500. Further, front cameras 1521 and 1522 for which the photoelectric conversion apparatus is used, an IR light source 1530 that emits infrared light, and a visible light source 1540 that emits visible light are disposed along the upper side of the front face of the electronic equipment 1500.

Furthermore, as indicated in FIG. 30B, rear cameras 1551 and 1552, for which the photoelectric conversion apparatus is used, an IR light source 1560 that emits an infrared light, and a visible light source 1570 that emits visible light are disposed along the upper side of the rear face of the electronic equipment 1500.

In the electronic equipment 1500 configured like this, a higher quality image can be captured, for example, by applying the above mentioned photoelectric conversion apparatus. The photoelectric conversion apparatus is also applicable to such electronic equipment as an infrared sensor, a distance measurement sensor using an active infrared light source, a security camera, and a personal or biological authentication camera. Thereby accuracy, performance and the like of this electronic equipment can be improved.

Various equipment were described in the above examples, but the present invention may also include a mechanical device. The mechanical device in a camera can drive components of the optical system for zooming, focusing and shutter operation. The mechanical device in a camera can also move the photoelectric conversion apparatus for vibration proof operation.

Equipment to which the present invention is applicable may be transporting equipment to transport a vehicle, ship, aircraft or the like. The mechanical device in the transporting equipment may be used as a moving device. The equipment used for the transporting equipment may be suitably used for transporting the photoelectric conversion apparatus, and in assisting and/or automating driving (steering) based on the image capturing function. The processing device for assisting and/or automating driving (steering) can perform processing to operate the mechanical device used for the moving device based on the information acquired by the photoelectric conversion apparatus.

Other Embodiments

The present invention is not limited to the above examples, but may be modified in various ways. For example, an example where a part of the configuration of any one of the above examples is added to another example, and an example where a part of the configuration is replaced with another example, are also included in the examples of the present invention. The above mentioned examples are all merely embodiment examples of the present invention, and are not intended to limit the technical scope of the present invention. In other words, the present invention can be carried out in various forms without departing from the technical spirit and scope of major characteristics thereof.

According to the present invention, highly accurate and high quality photoelectric conversion that is not easily influenced by noise very much is enabled.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-000022, filed on Jan. 1, 2022, which is hereby incorporated by reference herein in its entirety.

What is claimed is:

1. A photoelectric conversion apparatus comprising:
a pixel which includes a photoelectric conversion element;
a signal line connected with the pixel;
a voltage-current conversion unit configured to convert a voltage signal of the signal line into current; and
a conversion unit that includes an oversampling type analog-to-digital conversion circuit that converts the current outputted from the voltage-current conversion unit into digital signals,
wherein an output node of the signal line connects an input node of the voltage-current conversion unit,
wherein an input node of the conversion unit connects an output node of the voltage-current conversion unit, and
wherein a sample-and-hold unit does not exist between the output node of the signal line and the input node of the conversion unit.

2. The photoelectric conversion apparatus according to claim 1, wherein the voltage-current conversion unit includes a differential pair.

3. The photoelectric conversion apparatus according to claim 2, wherein a resistor is connected between sources of two transistors constituting the differential pair.

4. The photoelectric conversion apparatus according to claim 3, wherein the resistor is a variable resistor.

5. The photoelectric conversion apparatus according to claim 3, wherein the two transistors are N-type transistors.

6. The photoelectric conversion apparatus according to claim 2, wherein
the voltage-current conversion unit includes a differential stage that has the differential pair, and an amplification stage that amplifies the output current of the differential stage.

7. The photoelectric conversion apparatus according to claim 2, wherein
the differential pair is constituted of two P-type transistors.

8. The photoelectric conversion apparatus according to claim 1, wherein
the voltage-current conversion unit has a capacitor to clamp voltage corresponding to a reset level of the signal line.

9. The photoelectric conversion apparatus according to claim 1, wherein
the voltage-current conversion unit is for converting voltage, corresponding to a difference between reference voltage and the voltage of the signal line, into the current, and
includes a circuit configured to sample and hold the reference voltage.

10. The photoelectric conversion apparatus according to claim 1, wherein
the voltage-current conversion unit includes: a first transistor; a second transistor; a resistor which is connected between a source of the first transistor and a source of the second transistor; a first amplifier that drives a gate of the first transistor; and a second amplifier that drives a gate of the second transistor.

11. The photoelectric conversion apparatus according to claim 10, wherein
the voltage-current conversion unit includes a capacitor, which is configured to clamp voltage corresponding to the reset level of the signal line, between the signal line and at least one of the first amplifier and the second amplifier.

12. The photoelectric conversion apparatus according to claim 10, wherein
the first amplifier and the second amplifier are connectable to the signal line respectively.

13. The photoelectric conversion apparatus according to claim 10, wherein
the voltage-current conversion unit includes a circuit to sample and hold input of at least one of the first amplifier and the second amplifier.

14. The photoelectric conversion apparatus according to claim 10, wherein
output of the first amplifier can be inputted to input of the second amplifier.

15. A photoelectric conversion system comprising:
the photoelectric conversion apparatus according to claim 1; and
a signal processing unit configured to process a signal outputted from the photoelectric conversion apparatus.

16. Equipment comprising:
the photoelectric conversion apparatus according to claim 1; and
at least one of
an optical system corresponding to the photoelectric conversion apparatus,
a control device that controls the photoelectric conversion apparatus,
a processing device that processes a signal outputted from the photoelectric conversion apparatus,
a display device that displays information acquired by the photoelectric conversion apparatus,
a storage device that stores information acquired by the photoelectric conversion apparatus, and
a mechanical device that operates based on the information acquired by the photoelectric conversion apparatus.

17. The photoelectric conversion apparatus according to claim 1, wherein
the sample-and-hold unit does not exist between the input node of the voltage-current conversion unit and the output node of the voltage-current conversion unit.

18. A photoelectric conversion apparatus comprising:
a pixel which includes a photoelectric conversion element;
a signal line connected with the pixel;
a voltage-current conversion unit configured to convert a voltage signal of the signal line into current; and
a conversion unit that includes an oversampling type analog-to-digital conversion circuit that converts the current outputted from the voltage-current conversion unit into digital signals,
wherein an output node of the signal line connects an input node of the voltage-current conversion unit,
wherein an input node of the conversion unit connects an output node of the voltage-current conversion unit, and
wherein a signal path from the output node of the signal line to the input node of the conversion unit includes a path where a sample-and-hold unit does not exist.

19. A photoelectric conversion apparatus comprising:
a pixel which includes a photoelectric conversion element;
a signal line connected with the pixel;
a voltage-current conversion unit configured to convert a voltage signal of the signal line into current; and
a conversion unit that includes an oversampling type analog-to-digital conversion circuit that converts the current outputted from the voltage-current conversion unit into digital signals,
wherein an output node of the signal line connects an input node of the voltage-current conversion unit,
wherein an input node of the conversion unit connects an output node of the voltage-current conversion unit, and
wherein the voltage-current conversion unit is configured to enable to output the current, which was converted from the voltage signal of the signal line without sampling and holding, from the output node of the voltage-current conversion unit to the input node of the conversion unit.

* * * * *